US008841661B2

(12) United States Patent
Akimoto et al.

(10) Patent No.: US 8,841,661 B2
(45) Date of Patent: Sep. 23, 2014

(54) STAGGERED OXIDE SEMICONDUCTOR TFT SEMICONDUCTOR DEVICE AND MANUFACTURING METHOD THEREOF

(75) Inventors: Kengo Akimoto, Atsugi (JP); Masashi Tsubuku, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1054 days.

(21) Appl. No.: 12/700,758

(22) Filed: Feb. 5, 2010

(65) Prior Publication Data
US 2010/0213461 A1 Aug. 26, 2010

(30) Foreign Application Priority Data

Feb. 25, 2009 (JP) ................................. 2009-042575

(51) Int. Cl.
H01L 29/786 (2006.01)
H01L 27/12 (2006.01)
H01L 21/02 (2006.01)
(52) U.S. Cl.
CPC ....... *H01L 27/1214* (2013.01); *H01L 21/02554* (2013.01); *H01L 21/02631* (2013.01); *H01L 27/1225* (2013.01); *H01L 21/02565* (2013.01)
USPC .................... 257/43; 257/57; 257/E29.291
(58) Field of Classification Search
USPC ...................... 257/43, 57, E29.291
See application file for complete search history.

(56) References Cited

U.S. PATENT DOCUMENTS

| 5,470,768 A | 11/1995 | Yanai et al. |
| 5,731,856 A | 3/1998 | Kim et al. |
| 5,744,864 A | 4/1998 | Cillessen et al. |
| 5,847,410 A | 12/1998 | Nakajima |
| 5,879,973 A | 3/1999 | Yanai et al. |
| 6,294,274 B1 | 9/2001 | Kawazoe et al. |
| 6,338,990 B1 | 1/2002 | Yanai et al. |

(Continued)

FOREIGN PATENT DOCUMENTS

| CN | 001783458 | 6/2006 |
| CN | 101226901 | 7/2008 |

(Continued)

OTHER PUBLICATIONS

Prins et al., "A Ferroelectric Transparent Thin-Film Transistor," Appl. Phys. Lett. (Applied Physics Letters), Jun. 17, 1996, vol. 68, No. 25, pp. 3650-3652.

(Continued)

*Primary Examiner* — Alexander Sofocleous
*Assistant Examiner* — John P Dulka
(74) *Attorney, Agent, or Firm* — Eric J. Robinson; Robinson Intellectual Property Law Office, P.C.

(57) ABSTRACT

A method for forming a thin film transistor includes steps of forming a first wiring layer over a first electrode layer and forming a second wiring layer over a second electrode layer, wherein the first electrode layer extends beyond an end portion of the first wiring layer, the second electrode layer extends beyond an end portion of the second wiring layer, and a semiconductor layer is formed so as to be electrically connected to a side face and a top face of the first electrode layer and a side face and a top face of the second electrode layer.

12 Claims, 28 Drawing Sheets

(56) References Cited

U.S. PATENT DOCUMENTS

| | | |
|---|---|---|
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,394 B2 | 8/2009 | Furuta et al. |
| 7,674,650 B2 | 3/2010 | Akimoto et al. |
| 7,732,819 B2 | 6/2010 | Akimoto et al. |
| 7,749,825 B2 | 7/2010 | Honda |
| 7,919,365 B2 | 4/2011 | Kim et al. |
| 7,923,287 B2 | 4/2011 | Lee et al. |
| 7,981,734 B2 | 7/2011 | Furuta et al. |
| 8,134,156 B2 | 3/2012 | Akimoto |
| 8,158,464 B2 | 4/2012 | Akimoto |
| 8,222,098 B2 | 7/2012 | Honda |
| 8,253,252 B2 | 8/2012 | Shingu et al. |
| 8,368,079 B2 | 2/2013 | Akimoto |
| 8,525,165 B2 | 9/2013 | Akimoto |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0154397 A1 | 7/2006 | Takahashi et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1* | 8/2007 | Furuta et al. .................. 257/347 |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0003783 A1 | 1/2010 | Akimoto |
| 2010/0025678 A1 | 2/2010 | Yamazaki et al. |
| 2010/0065844 A1 | 3/2010 | Tokunaga |
| 2010/0090217 A1* | 4/2010 | Akimoto .................. 257/43 |
| 2010/0092800 A1 | 4/2010 | Itagaki et al. |
| 2010/0109002 A1 | 5/2010 | Itagaki et al. |
| 2010/0117077 A1 | 5/2010 | Yamazaki et al. |
| 2010/0163865 A1* | 7/2010 | Arai .................. 257/43 |
| 2012/0097964 A1 | 4/2012 | Honda |

FOREIGN PATENT DOCUMENTS

| | | |
|---|---|---|
| EP | 1737044 A | 12/2006 |
| EP | 1933385 A | 6/2008 |
| EP | 2226847 A | 9/2010 |
| JP | 60-198861 | 10/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 05-326553 A | 12/1993 |
| JP | 06-061259 A | 3/1994 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |

(56) References Cited

FOREIGN PATENT DOCUMENTS

| JP | 2002-289859 A | 10/2002 |
|---|---|---|
| JP | 2003-086000 A | 3/2003 |
| JP | 2003-086808 A | 3/2003 |
| JP | 2004-055735 A | 2/2004 |
| JP | 2004-103957 | 4/2004 |
| JP | 2004-273614 A | 9/2004 |
| JP | 2004-273732 A | 9/2004 |
| JP | 2007-081362 | 3/2007 |
| JP | 2007-096055 | 4/2007 |
| JP | 2007-123700 | 5/2007 |
| JP | 2007-123861 | 5/2007 |
| JP | 2007-134687 A | 5/2007 |
| JP | 2007-165861 A | 6/2007 |
| JP | 2007-250983 A | 9/2007 |
| JP | 2007-284342 A | 11/2007 |
| JP | 2008-535205 | 8/2008 |
| JP | 2008-270773 A | 11/2008 |
| JP | 2010-021170 A | 1/2010 |
| WO | WO-2004/114391 | 12/2004 |
| WO | WO-2007/043493 | 4/2007 |
| WO | WO-2007/058329 | 5/2007 |
| WO | WO-2007/089048 | 8/2007 |
| WO | WO-2007/119386 | 10/2007 |

OTHER PUBLICATIONS

Nakamura et al., "The Phase Relations in the $In_2O_3$—$Ga_2ZnO_4$—ZnO System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ (m= 3, 4, and 5), $InGaO_3(ZnO)_3$, and $Ga_2O_3(ZnO)m$ (m= 7, 8, 9, and 16) in the $In_2O_3$—$ZnGa_2O_4$—ZnO System," Journal of Solid State Chemistry, Apr. 1, 1995, vol. 116, No. 1, pp. 170-178.

Nakamura et al., "Syntheses and crystal structures of new homologous compounds, indium iron zinc oxides ($InFeO_3(ZnO)m$) (m: natural number) and related compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," Science, May 23, 2003, vol. 300, No. 5623, pp. 1269-1272.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Appled Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline $InGaO3(ZnO)5$ films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA Amoled Driven by the Threshold Voltage Controlled Amorphous Gizo (Ga2O3—In2O3—ZnO) TFT,", SID '08 : SID International Symposium Digest of Technical Papers. May 20, 2008, vol. 39, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura.M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density.Of States,", SID Digest '08 : SID International Symposium Digest of Technical Papers, 2008, Eng.vol. 39, pp. 1277-1280.

Janotti.A et al., "Oxygen Vacancies in ZnO,", Appl. Phys. Lett. (Applied Physics Letters) , 2005,.vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous.oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal ofn the Electrochemicalm Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett (Applied Physics Letters), Sep. 1, 2003, vol. 83, No. 9, pp. 1755-1757.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Dembo.H et al., "RFCPUS on Glass and Plastic Substrates Fabricated by TFT Transfer Technology,", IEDM 05: Technical Digest of International Electron Devices Meeting Dec. 5, 2005, pp. 1067-1069.

(56) References Cited

OTHER PUBLICATIONS

Ikeda.T et al., "Full-Functional System Liquid Crystal Display Using CG-Silicon Technology,", SID Digest '04 : SID International Symposium Digest of Technology Papers, 2004, vol. 35, pp. 860-863.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Osada.T et al., "15.2: Development of Driver-Integrated Panel using Amorphous In—Ga—Oxide TFT,", SID Digest '09 : SID International Symposium Digest of Technical Papers, May 31, 2009, pp. 184-187.

Li.C et al., "Modulated Structures of Homologous Compounds $InMO_3(ZnO)_m$ (M=In,Ga: M=Integer) Described by Four-Dimensional Superspace Group,", Journal of Solid State Chemistry, 1998, vol. 139, pp. 347-355.

Lee.J et al., "World's Largest (15-Inch) XGA AMLCD Panel Using IGZO Oxide TFT,", SID Digest '08 : SID Inernational Symposium Digest of Technical Papers, May 20, 2008, vol. 39, pp. 625-628.

Nowatari.H et al., "60.2: Intermediate Connector with Suppressed Voltage Loss for White Tandem OLEDS,", SID Digest '09 : SID International Symposium Digest of Technical Papers, May 31, 2009, pp. 899-902.

Kanno.H et al., "White Stacked Electrophosphorecent Organic Light-Emitting Device Employing $MoO_3$ as a Change-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Jeong.J et al., "3.1: Distinguised Paper: 12.1-Inch WXFA AMOLED Display Driven by Indium—Gallium—Zinc Oxide TFTs Array,", SID Digest '08 : SID International Sumposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y at al., "UHF RFCPUS on Flexible and Glass Substrates for Secure RFID System,", Journal of Solid-State Circuits, 2008 , vol. 43, No. 1, pp. 292-299.

Ohara.H eet al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D at al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho. D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M at al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D at al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J at al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size Amoled,", AM-FPD '08 Digest of Technical Papers, Jul. 2, 2008, pp. 275-277.

Parks at al., "Challenge to Future Displays: Transparent AM-OLED Driven by Peald Grown ZnO TFT,", IMID '07 Digest, 2007, p. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada. T et al., "Development of Driver-Intergrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) For AMLCDS,", Journal of the SID , 2007, vol. 15, No. 1, pp. 17-22.

Hosono.H et al., "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P.9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Paper, May 31, 2009, pp. 284-287.

Miyasaka.M, "58.2 Invited Paper : Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions of Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.

Lee.H at al., "Current Status of, Challenges to, and Perspective View of AM-OLED ,", IDW '06 : Proceedings of the 13th International Display Workshops, Dec. 7, 2006, pp. 663-666.

Kikuchi.H at al., "62,2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Kikuchi.H at al., "Polymer-Stabilized Liquid Crystal Blue Phases,", Nature Materials, Sep. 2, 2002, vol. 1, pp. 64-68.

Kimizuka.n. et al., "Spinel,$YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] At Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.

Meiboom.S at al., "Theory of the Blue Phase of Cholesteric Liquid Crystals,", Phys. Rev. Lett. (Physical Review Letters), May 4, 1981, vol. 46, No. 18, pp. 1216-1219.

Chinese Office Action (Application No. 201010126485.0) Dated Nov. 6, 2013.

* cited by examiner

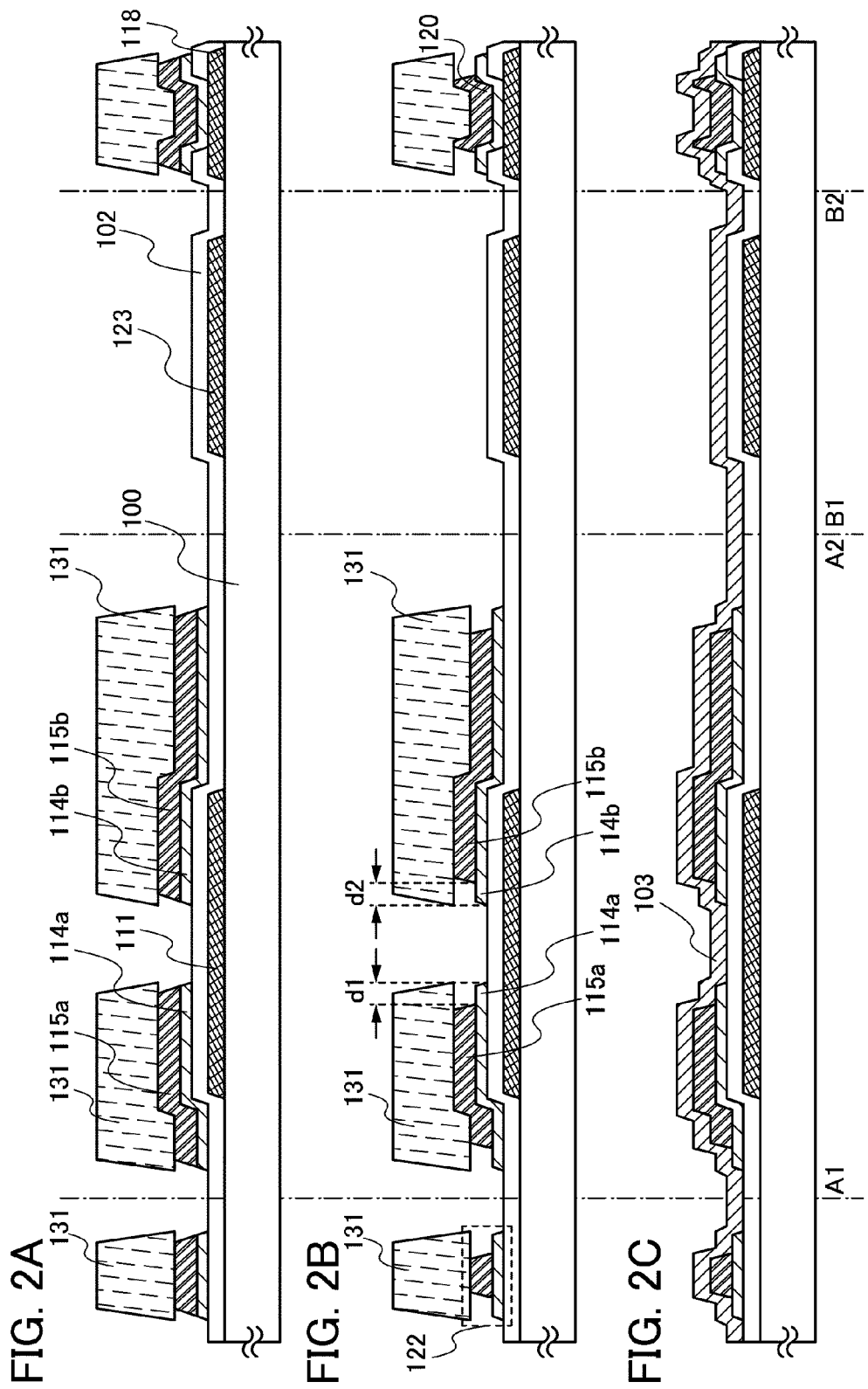

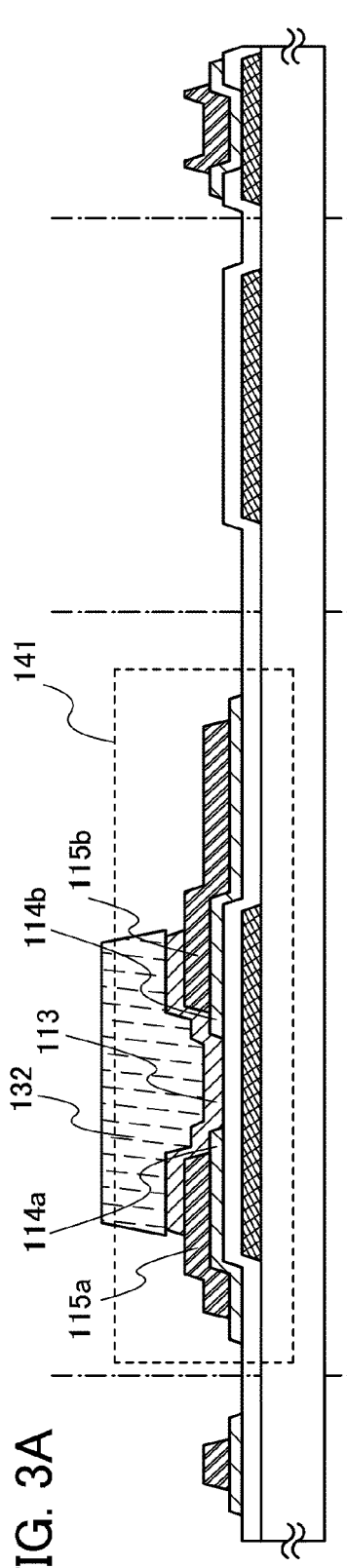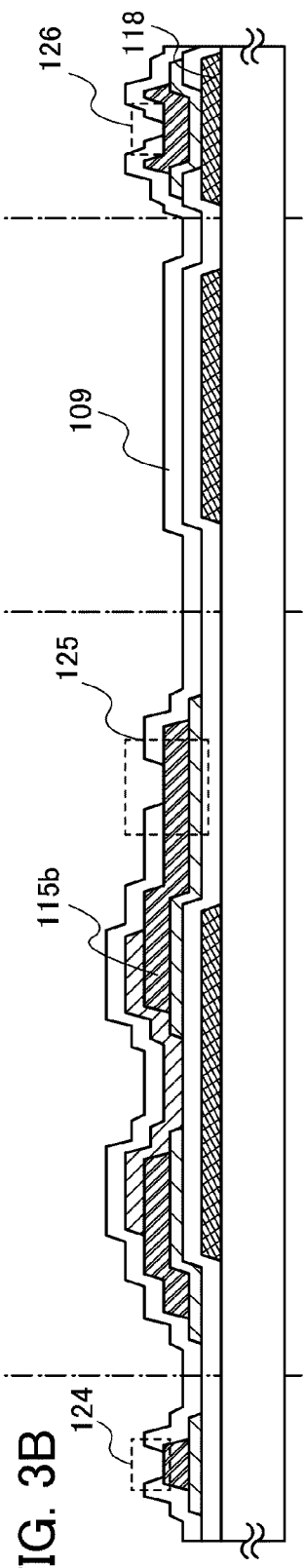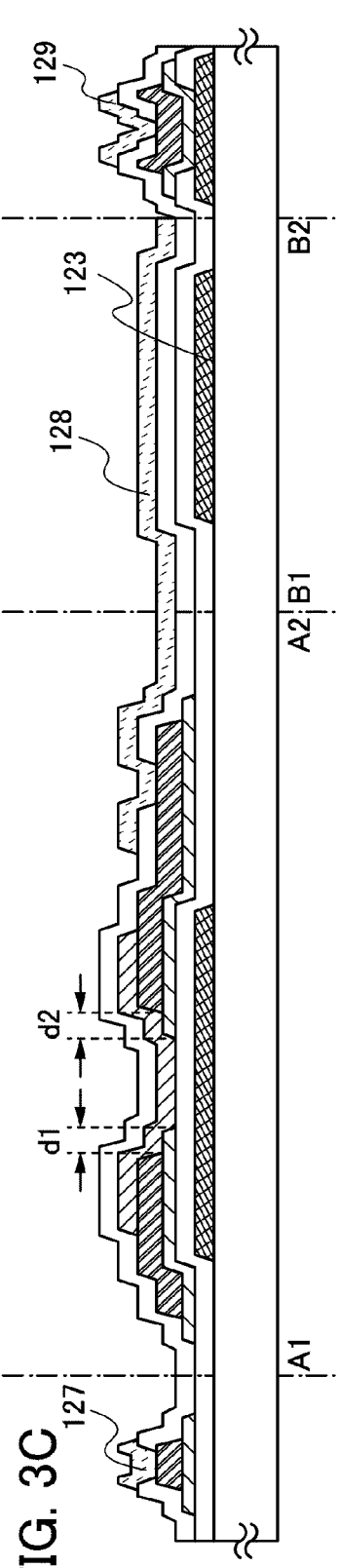

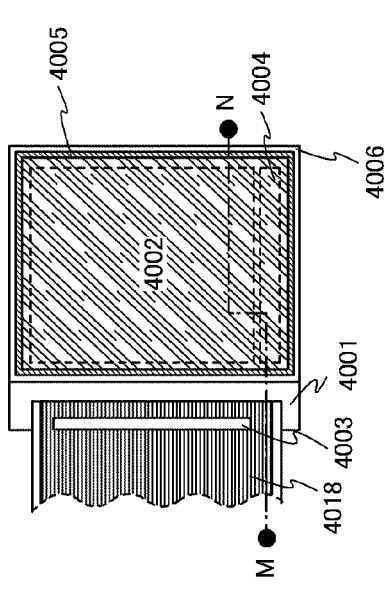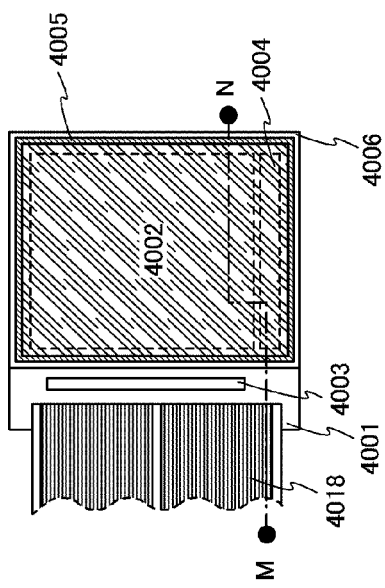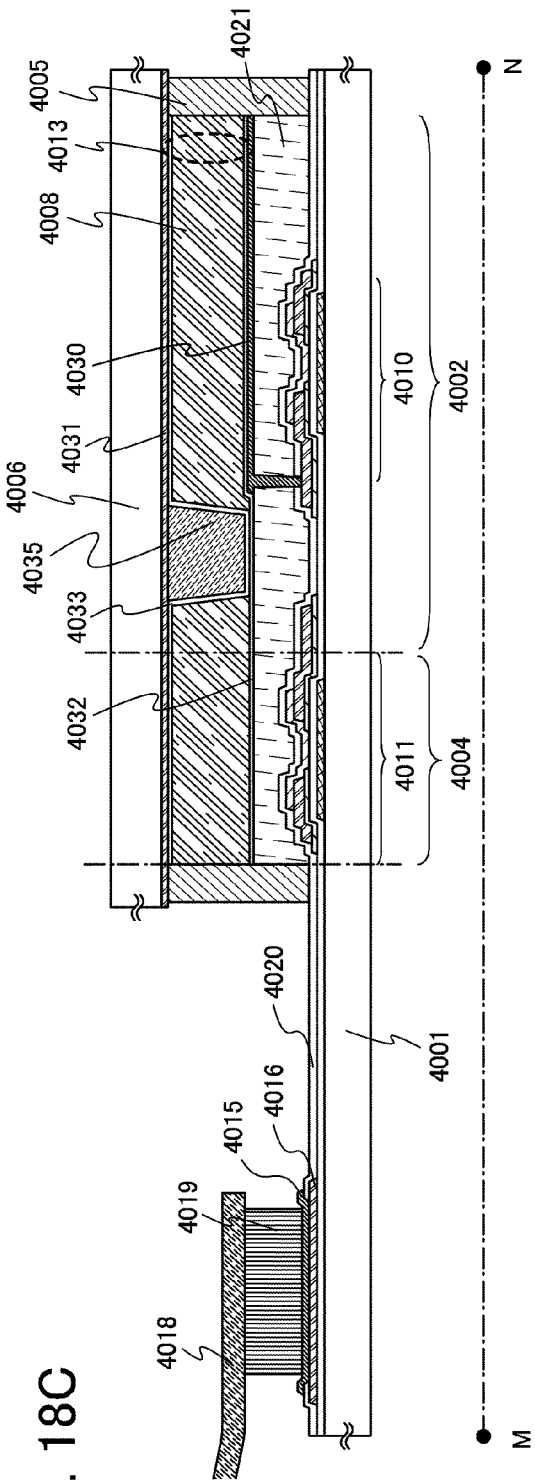
FIG. 18A
FIG. 18B
FIG. 18C

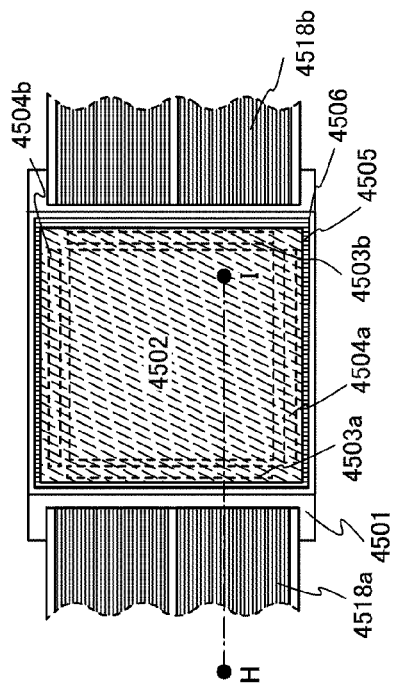
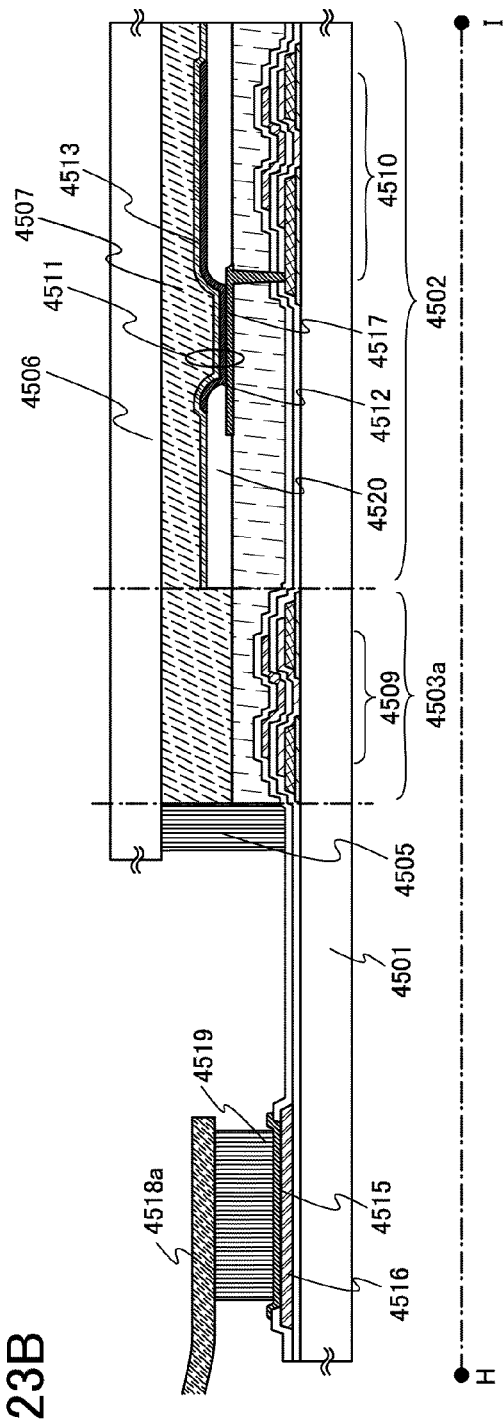
FIG. 23A
FIG. 23B

STAGGERED OXIDE SEMICONDUCTOR TFT SEMICONDUCTOR DEVICE AND MANUFACTURING METHOD THEREOF

BACKGROUND OF THE INVENTION

1. Field of the Invention

The present invention relates to semiconductor devices and display devices using the semiconductor devices, and further manufacturing methods thereof.

2. Description of the Related Art

There are a wide variety of metal oxides and such metal oxides are used for various applications. Indium oxide is a well-known material and is used as a transparent electrode material needed for a liquid crystal display and the like.

Some metal oxides exhibit semiconductor characteristics. Examples of such metal oxides having semiconductor characteristics include tungsten oxide, tin oxide, indium oxide, and zinc oxide. A thin film transistor having such metal oxide having semiconductor characteristics in its channel formation region has been proposed (Patent Documents 1 to 4 and Non-Patent Document 1).

As metal oxides, multi-component oxides as well as single-component oxides are known. For example, homologous compound, $InGaO_3(ZnO)_m$, (m is natural number) is known as a multi-component oxide having In, Ga and Zn (Non-Patent Documents 2 to 4).

Furthermore, it is confirmed that an oxide semiconductor including such an In—Ga—Zn-based oxide is applicable to a channel layer of a thin film transistor (Patent Document 5 and Non-Patent Documents 5 and 6).

In a conventional technique, amorphous silicon or polycrystalline silicon has been used for a thin film transistor (a TFT) provided for each pixel of an active matrix liquid crystal display. However, in place of these silicon materials, attention has been attracted to a technique for manufacturing a thin film transistor including such a metal oxide semiconductor described above. For example, in Patent Documents 6 to 9, a technique in which a thin film transistor is formed using zinc oxide or an In—Ga—Zn—O-based oxide semiconductor as a metal oxide semiconductor film and is used as a switching element or the like of an image display device is described. It is also known that semiconductors including elements of Group 14 other than silicon and compound semiconductors other than the oxide semiconductor described above can be used for channel layers of transistors.

In addition, an oxide semiconductor film can be deposited at temperature of 300° C. or lower by a sputtering method or the like, and thin film transistors having channel formation regions formed using oxide semiconductor can be easily formed in a wide region of a large substrate. Thus, application of oxide semiconductors to active matrix display devices has been expected.

REFERENCE

Patent Document

[Patent Document 1] Japanese Published Patent Application No S60-198861

[Patent Document 2] Japanese Published Patent Application No. H8-264794

[Patent Document 3] Japanese Translation of PCT International Application No. H11-505377

[Patent Document 4] Japanese Published Patent Application No. 2000-150900

[Patent Document 5] Japanese Published Patent Application No. 2004-103957

[Patent Document 6] Japanese Published Patent Application No. 2007-123861

[Patent Document 7] Japanese Published Patent Application No. 2007-96055

[Patent Document 8] Japanese Published Patent Application No. 2007-81362

[Patent Document 9] Japanese Published Patent Application No. 2007-123700

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor" (Appl. Phys. Lett., 17 Jun., 1996, Vol. 68, pp. 3650-3652).

[Non-Patent Document 2] M. Nakamura, N. Kimizuka, and T. Mohri, "The Phase Relations in the $In_2O_3$—$Ga_2ZnO_4$—ZnO System at 1350° C." (J. Solid State Chem., 1991, Vol. 93, pp. 298-315).

[Non-Patent Document 3] N. Kimizuka, M. Isobe, and M. Nakamura, "Syntheses and Single-Crystal Data of Homologous Compounds, $In_2O_3(ZnO)_m$, (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178.

[Non-Patent Document 4] M. Nakamura, N. Kimizuka, T. Mohri, and M. Isobe, "Homologous Series, Synthesis and Crystal Structure of $InFeO_3(ZnO)_m$ (m: natural number) and its Isostructural Compound", *KOTAI BUTSURI* (SOLID STATE PHYSICS), 1993, Vol. 28, No. 5, pp. 317-327.

[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272.

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492.

SUMMARY OF THE INVENTION

Active matrix liquid crystal display devices and active matrix light-emitting display devices need a large amount of driving current. For example, a large amount of driving current is needed for liquid crystal display devices, because voltage application of liquid crystal layers and charging in storage capacitors are conducted in a short gate-switching period. In particular, for liquid crystal display devices with large screens or high-definition liquid crystal display devices, a larger amount of drive current is necessary. Accordingly, a thin film transistor serving as a switching element preferably have high field-effect mobility, and low contact resistance between a semiconductor layer including a channel formation region and a source electrode layer and low contact resistance between the semiconductor layer and a drain electrode layer. For the similar reasons, wirings of the thin film transistor preferably have low electric resistance.

Further, in a structure where a semiconductor layer covers end portions of a source electrode layer and a drain electrode layer and at least a portion of steps existing in the end portions, carriers preferably move smoothly in the semiconductor layer covering at least the portion existing in the end portions. In addition, variations in transistor characteristics lead to display unevenness (mura) and thus structures and materials that hardly cause variations in field-effect mobility of a transistor and contact resistance are preferable.

It is an object of one embodiment of the present invention to provide a thin film transistor having low contact resistances between a semiconductor layer including a channel formation region and a source electrode layer and between the semiconductor layer and a drain electrode layer, of the thin film transistor. In addition, it is another object of one embodiment of the present invention to provide a thin film transistor having wirings with low electric resistance. Further, it is another object of one embodiment of the present invention to provide a structure in which carriers can move smoothly in a semiconductor layer covering at least a portion of steps existing in end portions of a source electrode layer and a drain electrode layer. Furthermore, it is another object of one embodiment of the present invention to provide a thin film transistor in which variations are hardly caused in the contact resistance between a semiconductor layer including a channel formation region and a source electrode layer and in the contact resistance between the semiconductor layer and a drain electrode layer. Further, it is still another object of one embodiment of the present invention is to provide display devices having such thin film transistor including semiconductor.

A preferable formation method of a thin film transistor includes steps of forming a first wiring layer over a first electrode layer and forming a second wiring layer over a second electrode layer, wherein the first electrode layer extends beyond an end portion of the first wiring layer, the second electrode layer extends beyond an end portion of the second wiring layer, and a semiconductor layer is formed so as to be electrically connected to a side face and a top face of the first electrode layer and a side face and a top face of the second electrode layer.

One embodiment of the present invention is a semiconductor device including a gate electrode layer; a gate insulating film over the gate electrode layer; a first electrode layer and a second electrode layer whose end portions overlap with the gate electrode layer, over the gate insulating film; and a first wiring layer over the first electrode layer, a second wiring layer over the second electrode layer, and an oxide semiconductor layer in a region overlapping with the gate electrode layer. In the semiconductor device, the first electrode layer extends beyond an end portion of the first wiring layer; the second electrode layer extends beyond an end portion of the second wiring layer; the oxide semiconductor layer is electrically connected to a side face and a top face of the first electrode layer and a side face and a top face of the second electrode layer; and the gate insulating film over the gate electrode layer has a region in contact with the oxide semiconductor layer between a region in contact with the first electrode layer and a region in contact with the second electrode layer.

Further, one embodiment of the present invention is the semiconductor device wherein a width (d1) which is from the end portion of the first electrode layer to the end portion of the first wiring layer or a width (d2) which is from the end portion of the second electrode layer to the end portion of the second wiring layer is within the range of from 0.2 µm to 5 µm, inclusive.

In addition, one embodiment of the present invention is the semiconductor device wherein a thickness of the oxide semiconductor layer is within the range of from 5 nm to 200 nm inclusive, preferably from 20 nm to 60 nm inclusive; and a thickness of the first electrode layer or the second electrode layer is within the range of from 5 nm to 200 nm, inclusive, preferably within the range of from 5 nm to a half of the thickness of the oxide semiconductor layer.

Another embodiment of the present invention is a semiconductor device including a first electrode layer and a second electrode layer; a first wiring layer over the first electrode layer; a second wiring layer over the second electrode layer; an oxide semiconductor layer over the first electrode layer and the second electrode layer; a gate insulating film over the oxide semiconductor layer; and a gate electrode layer overlapping with end portions of the first electrode layer and the second electrode layer with the gate insulating film therebetween. In the semiconductor device, the first electrode layer extends beyond an end portion of the first wiring layer; the second electrode layer extends beyond an end portion of the second wiring layer; and the oxide semiconductor layer is electrically connected to a side face and a top face of the first electrode layer and a side face and a top face of the second electrode layer.

Further, one embodiment of the present invention is the semiconductor device wherein a width (d1) which is from the end portion of the first electrode layer to the end portion of the first wiring layer or a width (d2) which is from the end portion of the second electrode layer to the end portion of the second wiring layer is within the range of from 0.2 µm to 5 µm, inclusive.

In addition, one embodiment of the present invention is the semiconductor device wherein a thickness of the oxide semiconductor layer is within the range of from 5 nm to 200 nm inclusive, preferably 20 nm to 60 nm inclusive; and a thickness of the first electrode layer or the second electrode layer is within the range of from 5 nm to 200 nm, inclusive, preferably within the range of from 5 nm to a half of the thickness of the oxide semiconductor layer.

Alternatively, one embodiment of the present invention is a method for manufacturing a semiconductor device, including the steps of forming a gate electrode layer over a substrate; forming a gate insulating film over the gate electrode layer; forming a first electrode layer and a second electrode layer whose end portions overlap with the gate electrode layer, over the gate insulating film; forming a first wiring layer over the first electrode layer in such a way that the first electrode layer extends beyond an end portion of the first wiring layer, and a second wiring layer over the second electrode layer in such a way that the second electrode layer extends beyond an end portion of the second wiring layer; forming an oxide semiconductor layer so as to be electrically connected to a side face and a top face of the first electrode layer and a side face and a top face of the second electrode layer in a region overlapping with the gate electrode layer, and to be in contact with the gate insulating film in a region between a region in contact with the first electrode layer and a region in contact with the second electrode layer, of the gate insulating film over the gate electrode layer.

Alternatively, one embodiment of the present invention is a method for manufacturing a semiconductor device, including the steps of forming a first electrode layer and a second electrode layer over a substrate; forming a first wiring layer over the first electrode layer in a such a way that the first electrode layer extends beyond an end portion of the first wiring layer, and a second wiring layer over the second electrode layer in a such a way that the second electrode layer extends beyond an end portion of the second wiring layer; forming an oxide semiconductor layer so as to be electrically connected to a side face and a top face of the first electrode layer and a side face and a top face of the second electrode layer; forming a gate insulating film over the oxide semiconductor layer; and forming a gate electrode layer overlapping with end portions of the first electrode layer and the second electrode layer with the gate insulating film therebetween.

Note that the ordinal numbers such as "first" and "second" in this specification are used for convenience and do not denote the order of steps and the stacking order of layers. In addition, the ordinal numbers in this specification do not denote particular names which specify the invention.

Further, the term "semiconductor device" in this specification generally indicates all devices that are capable of functioning with use of semiconductor characteristics, and semiconductor circuits, electro-optic devices and electronic devices using semiconductor characteristics are all semiconductor devices.

In a thin film transistor, a first wiring layer is formed over a first electrode layer; a second wiring layer is formed over a second electrode layer; the first electrode layer extends beyond an end portion of the first wiring layer; the second electrode layer extends beyond an end portion of the second wiring layer; and a semiconductor layer is electrically connected to a side face and a top face of the first electrode layer, and the semiconductor layer is electrically connected to a side face and a top face of the second electrode layer, whereby the contact resistance between the semiconductor layer including a channel formation region and source and drain electrode layers can be lowered. Further, the thickness of wirings can be made small, which leads to lower electric resistance. In addition, carriers can move smoothly in the semiconductor layer covering the end portions of the source electrode layer and the drain electrode layer and at least a portion of steps existing in the end portions. Moreover, a thin film transistor in which variations are hardly caused in the contact resistances between the semiconductor layer including the channel formation region and the source electrode layer and between the semiconductor layer and the drain electrode layer and whose characteristics hardly vary can be provided.

Further, a display device with high electric characteristics and high reliability can be provided using the thin film transistors in a pixel portion and a driver circuit portion of the display device.

BRIEF DESCRIPTION OF THE DRAWINGS

In the accompanying drawings:

FIGS. 2A to 2C illustrate a manufacturing method of a semiconductor device according to one embodiment of the present invention;

FIGS. 3A to 3C illustrate a manufacturing method of a semiconductor device according to one embodiment of the present invention;

FIGS. 18A to 18C illustrate a semiconductor device according to one embodiment of the present invention;

FIGS. 23A and 23B illustrate a semiconductor device according to one embodiment of the present invention;

DETAILED DESCRIPTION OF THE INVENTION

Figure 1A:
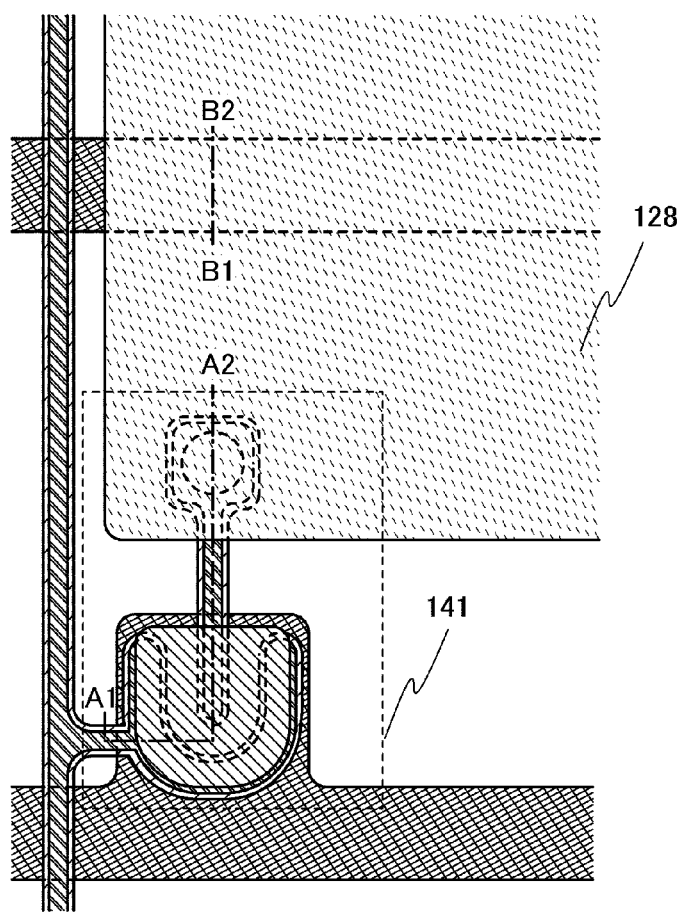
FIGS. 1A to 1C illustrate a semiconductor device according to one embodiment of the present invention.

Embodiments will now be described in detail with reference to the drawings. It is easily understood by those skilled in the art that modes and details disclosed herein can be modified in various ways without departing from the spirit and scope of the present invention. Accordingly, the present invention should not be limited to description of the embodiments given below. Note that in the structures of the present invention described below, the same portions or portions having similar functions are denoted by the same reference numerals through different drawings, and description of such portions is not repeated in some cases.

Embodiment 1

In Embodiment 1, a structure of a thin film transistor, which is one embodiment of the present invention, is described.

Figure 1B:
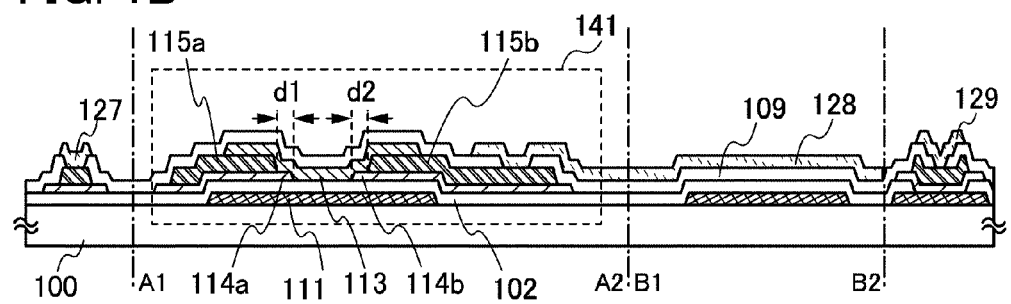
Figure 1C:
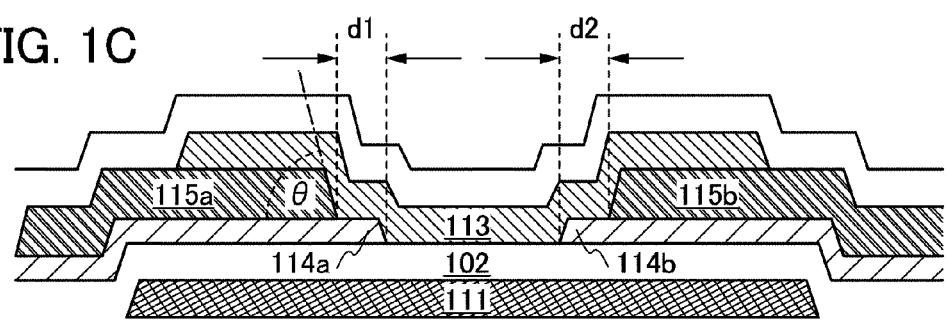

A thin film transistor having a bottom-gate structure of this embodiment is illustrated in FIGS. 1A to 1C. FIG. 1A is a top view and FIG. 1B is a cross-sectional view taken along the line A1-A2 and the line B1-B2 of FIG. 1A. FIG. 1C is a cross-sectional view in which a portion where an electrode layer of the thin film transistor in FIG. 1B is in contact with a semiconductor layer is enlarged.

In the thin film transistor 141 illustrated in FIGS. 1A to 1C, a gate electrode layer 111 is formed over a substrate 100, a gate insulating film 102 is formed over the gate electrode layer 111, and a first electrode layer 114a and a second electrode layer 114b serving as a source electrode layer and a drain electrode layer are formed over the gate insulating film 102 in such a way that end portions of the first electrode layer 114a and the second electrode layer 114b overlap with the gate electrode layer 111. A first wiring layer 115a and a second wiring layer 115b are formed over the first electrode layer 114a and the second electrode layer 114b respectively, and the first electrode layer 114a and the second electrode layer 114b extend outside from end portions of the first wiring layer 115a and the second wiring layer 115b, respectively. The semiconductor layer 113 is formed so as to overlap with the gate electrode layer 111 and to be in contact with side faces and top faces of the first electrode layer 114a and the second electrode layer 114b. In addition, the gate insulating film 102 over the gate electrode layer 111 has a region in contact with the semiconductor layer 113 between a region in contact with the first electrode layer 114a and a region in contact with the second electrode layer 114b.

In FIG. 1B, any of the following substrates can be used as the substrate 100: an alkali-free glass substrate formed using barium borosilicate glass, aluminoborosilicate glass, aluminosilicate glass, or the like manufactured by a fusion method or a float method; a ceramic substrate; a plastic substrate having heat resistance enough to withstand a process temperature of a manufacturing process of a semiconductor device; and the like. For example, a glass substrate which includes more barium oxide (BaO) than boron oxide ($B_2O_3$) at composition ratios and whose strain point is 730° C. or higher is preferable. This is because such a glass substrate is not strained even when the oxide semiconductor layer which forms the semiconductor layer is thermally processed at high temperatures of about 700° C.

Alternatively, a metal substrate such as a stainless steel alloy substrate, which is provided with an insulating film over its surface may also be used. When the substrate 100 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

Further, an insulating film may be provided as a base film over the substrate 100. The base film can be formed with a single-layer structure or a stacked structure of a silicon oxide film, a silicon nitride film, a silicon oxynitride film, and/or a silicon nitride oxide film by a CVD method, a sputtering method, or the like.

The gate electrode layer 111 can be formed with a single-layer structure or a stacked structure using a metal material such as aluminum (Al), copper (Cu), gold (Au), silver (Ag), platinum (Pt), molybdenum (Mo), titanium (Ti), chromium (Cr), tantalum (Ta), tungsten (W), neodymium (Nd), or scandium (Sc); an alloy material containing any of these metal materials as its main component; and/or a nitride containing any of these metal materials as its component. The gate electrode layer 111 is preferably formed using a low-resistance conductive material such as aluminum or copper; however, the low-resistance conductive material has disadvantages of low heat resistance and being easily eroded. Thus, the low-resistance conductive material is preferably used in combination with a heat-resistant conductive material. As the heat-resistant conductive material, molybdenum, titanium, chromium, tantalum, tungsten, neodymium, scandium, or the like is used.

As a conductive film including aluminum as a first component, it is preferable to use an aluminum alloy to which an element such as titanium (Ti), tantalum (Ta), tungsten (W), molybdenum (Mo), chromium (Cr), neodymium (Nd), scandium (Sc), nickel (Ni), platinum (Pt), copper (Cu), gold (Au), silver (Ag), manganese (Mn), carbon (C), or silicon (Si), or an alloy material or compound including any of these elements as a main component is added.

For example, when a conductive film formed of a heat-resistant conductive material is stacked over a low-resistant conductive film, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable.

Alternatively, a transparent conductive film may be used, and as a material of the transparent conductive film, indium oxide-tin oxide alloy ($In_2O_3$—$SnO_2$, abbreviated as ITO), indium tin oxide containing silicon or silicon oxide, indium zinc oxide, zinc oxide, zinc oxide to which aluminum or gallium is added (AZO or GZO) or the like can be used.

Examples of an insulating film which can be used as the gate insulating film 102 include a silicon oxide film, a silicon nitride film, a silicon oxynitride film, a silicon nitride oxide film, an aluminum oxide film, an aluminum nitride film, a magnesium oxide film, an yttrium oxide film, a hafnium oxide film, or a tantalum oxide film. A single layer or a stacked layer including any of these may be used.

Note that in this specification, the term "oxynitride" refers to a substance that contains more oxygen atoms than nitrogen atoms and the term "nitride oxide" refers to a substance that contains more nitrogen atoms than oxygen atoms. For example, a "silicon oxynitride film" means a film that contains more oxygen atoms than nitrogen atoms, and oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively, when they are measured by RBS (Rutherford Backscattering Spectrometry) and HFS (Hydrogen Forward Scattering). Further, a "silicon nitride oxide film" means a film that contains more nitrogen atoms than oxygen atoms, and oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively, when they are measured by RBS and HFS. Note that percentages of nitrogen, oxygen, silicon, and hydrogen fall within the ranges given above, where the total number of atoms contained in the silicon oxynitride or the silicon nitride oxide is defined as 100 at. %.

The gate insulating film may have a single-layer structure or a stacked structure in which two or three insulating films are stacked. For example, by forming the gate insulating film in contact with the substrate, using a silicon nitride film or a silicon nitride oxide film, adhesion between the substrate and the gate insulating film is increased, and in the case where a glass substrate is used as the substrate, an impurity can be prevented from diffusing into the semiconductor layer from the substrate and further, the gate electrode layer can be prevented from being oxidized. That is to say, film peeling can be prevented, and thus electric characteristics of a thin film transistor which is completed later can be improved.

The first electrode layer 114a and the second electrode layer 114b are formed using a conductive layer. In particular, in a case where an element included in the semiconductor layer 113 or an element in the deposition atmosphere is diffused into the interface between the electrode layers and the semiconductor layer to produce a mixed layer, a conductive material and a semiconductor material is preferably combined so that the mixed layer can have conductivity. For example, when an oxide semiconductor is used as the semiconductor layer, molybdenum (Mo), titanium (Ti) or tungsten (W) is used for the first electrode layer 114a and the second electrode layer 114b, and a produced oxide film can have conductivity, which is preferable. Alternatively, an oxide having high conductivity such as an indium oxide-tin oxide alloy, indium tin oxide containing silicon or silicon oxide, indium zinc oxide, zinc oxide, zinc oxide to which aluminum or gallium is added (AZO or GZO) can be used.

In addition, the thickness of the first electrode layer 114a and the second electrode layer 114b is preferably from 5 nm to 200 nm, more preferably half or less the thickness of the semiconductor layer 113. As the thickness of the first electrode layer 114a and the second electrode layer 114b is smaller, a step existing over the gate insulating layer is smaller. Thus, it is easier for the semiconductor layer to cross over the step, being in contact with the top face of the gate insulating layer, and at least one of the side face of the first electrode layer 114a, the side face of the second electrode layer 114b, the top face of the first electrode layer 114a and the top face of the second electrode layer 114b. As a result, the semiconductor layer including a channel formation region can be formed, without hindrance to carrier movement in the semiconductor layer in contact with the step portion, due to space or the like. The cross-sectional shapes of the end portions of the first electrode layer 114a and the second electrode layer 114b each be a wedge-like shape (in which the thickness of the end portions of the first electrode layer 114a and the second electrode layer 114b is linearly increased from the base), a downwardly arcuate shape (like an arc having a downwardly protruding shape), an upwardly arcuate shape (like an arc having an upwardly protruding shape), or an S-like shape. This is preferable, because, at this time, the step existing in the end portions of the first electrode layer 114a and the second electrode layer 114b is smaller. On the other hand, when the electrode layer is too thin, processing is difficult and electric resistance is high and thus the electrode layer cannot serve as an electrode. The channel length L of the thin film transistor having the first electrode layer 114a and the second electrode layer 114b as the source electrode layer and the drain electrode layer respectively corresponds to the interval between the first electrode layer 114a and the second electrode layer 114b.

In addition, FIG. 1C is a cross-sectional view in which the portion where the first electrode layer 114a and the second electrode layer 114b are in contact with the semiconductor layer 113 is enlarged. The width d1 or d2 in FIG. 1C is preferably from 0.2 µm to 5 µm, and d1 is a width from the end portion of the first electrode layer 114a that is in contact with the base (here, the gate insulating film 102) to the end portion of the first wiring layer 115a that is in contact with the first electrode layer 114a, and d2 is a width from the end portion of the second electrode layer 114b that is in contact with the base (here, the gate insulating film 102) to the end portion of the second wiring layer 115b that is in contact with the second electrode layer 114b. If the d1 or d2 (the width of the electrode layer extending outside from the end portion of the wiring layer) is too small, the contact area with the semiconductor layer is small, which might cause defects. On the other hand, if it is too large, processing becomes complicated. In addition, the taper angle (θ) of the end portion of the first wiring layer 115a or the second wiring layer 115b is preferably smaller than 90°, but even if a shape of the end portion is an inversed taper having the taper angle of 90° or larger, as long as the width d1 or d2 (the width of the electrode layer extending outside from the end portion of the wiring layer) is 0.2 µm or more, the electrode layer and the semiconductor layer can be electrically connected well.

The first wiring layer 115a and the second wiring layer 115b can be formed using a material similar to the gate electrode layer 111. In particular, aluminum is preferable because it has low electric resistance, is easy to be processed, and is inexpensive. Further, the thickness of the first wiring layer 115a and the second wiring layer 115b is preferably from 5 nm to 1000 nm As the thickness of the wiring layers is larger, the wiring resistance is lowered, but if the thickness is too large, it will take long to deposit the wiring layers and stress is increased to cause film peeling. Note that the cross-sectional shapes of the end portions of the wiring layers may each be a wedge-like shape (in which the thickness of the end portions of the first electrode layer 114a and the second electrode layer 114b is linearly increased from the base), a downwardly arcuate shape (like an arc having a downwardly protruding shape), an upwardly arcuate shape (like an arc having an upwardly protruding shape), or an S-like shape, so that the oxide semiconductor layer which forms semiconductor layer easily covers the end portions of the wiring layers.

In addition, disconnection due to steps of the film crossing over the end portion of the first electrode layer 114a and the end portion of the first wiring layer 115a, or the film crossing over the end portion of the second electrode layer 114b and the end portion of the second wiring layer 115b hardly occurs, because the electrode layers extend outside the end portions of the wiring layers and the steps are released.

Examples of the semiconductor used in this specification include semiconductors including Group 14 element typified by Si, Ge or SiC; compound semiconductors such as GaAs, InP, ZnSe, CdS, or CuAlOS; nitride semiconductors such as GaN, MN, or InN; and oxide semiconductors such as ZnO or $CuAlO_2$. Further, the semiconductor may be amorphous, microcrystalline, polycrystalline, or single crystal.

In this embodiment, as an oxide semiconductor which forms the semiconductor layer 113, it is preferable to use an oxide semiconductor whose composition formula is represented by $InMO_3(ZnO)_m$ (m>0). In particular, it is preferable to use an In—Ga—Zn—O-based oxide semiconductor. Note that M denotes one or more of metal elements selected from gallium (Ga), iron (Fe), nickel (Ni), manganese (Mn), and cobalt (Co). In addition to a case where only Ga is contained as M, there is a case where Ga and the above metal elements other than Ga, for example, Ga and Ni or Ga and Fe are contained as M. Moreover, in the oxide semiconductor, in some cases, another transition metal element such as Fe or Ni or an oxide of the transition metal is contained as an impurity element in addition to a metal element contained as M. In this specification, among the oxide semiconductors whose composition formulas are represented by $InMO_3(ZnO)_m$ (m>0), an oxide semiconductor whose composition formula includes at least Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

By X-ray diffraction (XRD) spectrometry, an amorphous structure is observed in the In—Ga—Zn—O based nonsingle-crystal film. In addition, the In—Ga—Zn—O-based non-single-crystal film is formed by a sputtering method and then subjected to thermal treatment at 200° C. to 500° C., typically 300° C. to 400° C. for 10 minutes to 100 minutes.

However, the oxide semiconductor which forms the semiconductor layer 113 is not limited to the oxide semiconductor whose composition formula is represented by $InMO_3(ZnO)_m$ (m>0). For example, an oxide semiconductor layer made of indium oxide ($InO_x$), zinc oxide ($ZnO_x$), tin oxide (SnO), indium zinc oxide (IZO), indium tin oxide (ITO), indium tin oxide containing silicon oxide (ITSO), indium zinc oxide containing silicon oxide (IZO containing $SiO_x$), zinc oxide containing silicon oxide (ZSO), zinc oxide including silicon oxide and tin oxide (TSZO), zinc oxide doped with gallium (GZO), or the like may be used.

The thickness of the semiconductor layer 113 is from 5 nm to 200 nm, preferably from 20 nm to 60 nm.

The range of the carrier concentration of the semiconductor layer 113 is preferably lower than $1 \times 10^{17}/cm^3$ (more preferably, $1 \times 10^{11}/cm^3$ or higher). When the carrier concentration of the semiconductor layer 113 is not in the above range, the thin film transistor has a risk of being normally on.

As the oxide semiconductor applied to the semiconductor layer 113, any of the following oxide semiconductors can be applied in addition to the above: an In—Sn—Zn—O-based oxide semiconductor; a Sn—Ga—Zn—O-based oxide semiconductor; an In—Zn—O-based oxide semiconductor; a Sn—Zn—O-based oxide semiconductor; a Ga—Zn—O-based oxide semiconductor; an In—O-based oxide semiconductor; a Sn—O-based oxide semiconductor; and a Zn—O-based oxide semiconductor. In other words, when an insulating impurity is included in such an oxide semiconductor, crystallization of the semiconductor layer 113 is suppressed and thus characteristics of the thin film transistor can be stabilized.

Further, the semiconductor layer 113 may contain an insulating impurity. As the impurity, insulating oxide typified by silicon oxide, germanium oxide, or the like; insulating nitride typified by silicon nitride or the like; or insulating oxynitride such as silicon oxynitride or the like can be applied.

Such an insulating oxide or insulating nitride is added to the oxide semiconductor at a concentration at which electrical conductivity of the oxide semiconductor does not deteriorate.

Such an insulating impurity is contained in the semiconductor layer 113, whereby crystallization of the semiconductor layer 113 can be suppressed. By suppression of crystallization of the semiconductor layer 113, characteristics of the thin film transistor can be stabilized.

In addition, when the In—Ga—Zn—O-based oxide semiconductor contains an impurity such as silicon oxide, crystallization of the oxide semiconductor or generation of microcrystal grains can be prevented even by heat treatment at 300° C. to 600° C.

In a manufacturing process of the thin film transistor in which an In—Ga—Zn—O-based oxide semiconductor is used for its channel formation region, the S value (a subthreshold swing value) or the electrical field-effect mobility can be improved by heat treatment. Even in such a case, the thin film transistor can be prevented from being normally-on. Further, even when heat stress or bias stress is added to the thin film transistor, variations in the threshold voltage can be prevented.

With the above-described structure, carriers can move smoothly in the semiconductor layer covering the end portions of the source electrode layer and the drain electrode layer and at least a portion of steps existing in the end portions. In addition, because the contact areas between the source electrode layer and the semiconductor layer including the channel formation region and between the drain electrode layer and the semiconductor layer are sufficiently large, the contact resistance is reduced and further hardly varies. Therefore, a thin film transistor having fewer variations in characteristics caused by the variation of the contact resistance can be provided. In addition, the wirings connected to the source electrode layer and the drain electrode layer can be made thicker, and thus electric resistance of the wirings can be lowered.

Note that the structure described in this embodiment can be combined with any structure exemplified in the other embodiments as appropriate.

Embodiment 2

A manufacturing method of the thin film transistor 141 illustrated in FIGS. 1A and 1B will now be described with reference to FIGS. 2A to 2C and FIGS. 3A to 3C. Specifically, a manufacturing process of a pixel portion of a display device including the thin film transistor will be described.

The substrate 100 is a substrate similar to the substrate in Embodiment 1, and the material of the conductive film used for the gate electrode layer described in Embodiment 1 is deposited entirely over the substrate 100 by a sputtering method or a vacuum evaporation method. Next, a first photolithography process is performed to form a resist mask, and unnecessary portions are removed by etching to form a gate wiring including the gate electrode layer 111, a capacitor wiring 123, and a first terminal 118. At this time, etching is preferably performed so that at least an end portion of the gate electrode layer 111 has a taper shape, for the sake of prevention of disconnection due to a step.

Then, the gate insulating film 102 is entirely formed over the gate electrode layer 111. The gate insulating film 102 is formed to a thickness of 50 nm to 250 nm by a CVD method, a sputtering method, or the like.

For example, for the gate insulating film 102, a silicon oxide film is formed to a thickness of 100 nm by a CVD method or a sputtering method. Needless to say, the gate insulating film 102 is not limited to the silicon oxide film, and can be formed with a single layer or a stacked layer of various materials described in Embodiment 1.

Alternatively, as the gate insulating film 102, a silicon oxide layer can be formed by a CVD method using an organosilane gas. As the organosilane gas, the following compounds containing silicon can be used: ethyl silicate (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like.

Next, a second photolithography process is performed to form a resist mask, and an unnecessary portion of the gate insulating film 102 is removed by etching, whereby a contact hole (not illustrated) that reaches a wiring or the electrode layer which is formed from the same material as the gate electrode layer 111 is formed. This contact hole is provided for directly connecting a gate wiring or the electrode layer with a conductive film to be formed later. For example, in a driver circuit portion, a contact hole is formed when a thin film transistor whose gate electrode layer is direct contact with a source electrode layer or a drain electrode layer, or a terminal that is electrically connected to a gate wiring of a terminal portion is formed.

Next, a lower conductive film serving as the first electrode layer 114a and the second electrode layer 114b is formed over the gate insulating film 102. In addition, an upper conductive film serving as the first wiring layer 115a and the second wiring layer 115b is stacked over the lower conductive film. Note that the lower conductive film and the upper conductive film can be formed by a sputtering method or a vacuum evaporation method.

The lower conductive film serving as the first electrode layer 114a and the second electrode layer 114b is formed using the conductive material described in Embodiment 1. In addition, the upper conductive film serving as the first wiring layer 115a and the second wiring layer 115b can be formed using a material similar to the gate electrode layer 111 described in Embodiment 1. In addition, the lower conductive film and the upper conductive film can be formed with a single layer or a stacked layer.

An unnecessary portion of the lower conductive film and the upper conductive film is removed by using the same resist mask, the first wiring layer and the second wiring layer are formed over the first electrode layer and the second electrode layer respectively, the first electrode layer extends beyond the end portion of the first wiring layer, and the second electrode layer extends beyond the end portion of the second wiring layer. That case is preferable since the process can be simplified.

For removing the unnecessary portion of the lower conductive film and the upper conductive film using the same resist mask, materials for the lower conductive film and the upper conductive film are preferably combined so that the etching rate of the material used for the upper conductive film is sufficiently higher than that of the material used for the lower conductive film.

In this embodiment, a 20-nm-thick titanium film is used as the lower conductive film, and a 150-nm-thick aluminum film is used as the upper conductive film. Titanium has heat resistance, and further is a conductive material which can be electrically well connected to an In—Ga—Zn—O-based oxide semiconductor. In addition, aluminum is a material having low wiring resistance. With such a structure, the step existing over the gate insulating film is made smaller and the electrode layer and the wiring layer with reduced wiring resistance can be formed, and further the unnecessary portion of the lower conductive film and the upper conductive film can be removed by the same resist mask; therefore the process can be simplified.

Next, a third photolithography process is conducted to form resist masks 131, and the upper conductive film and the lower conductive film are etched by first etching to form the first electrode layer 114a, the second electrode layer 114b, the first wiring layer 115a, the second wiring layer 115b, and a second terminal portion. Wet etching or dry etching is used as the etching method at this time.

For example, when the lower conductive film is formed using titanium and the upper conductive film is formed using aluminum, wet etching can be performed using a hydrogen peroxide solution, heated hydrochloric acid, or a nitric acid solution containing ammonium fluoride as an etchant. In addition, the lower conductive film (titanium) and the upper conductive film (aluminum) are etched with use of KSMF-240 (produced by KANTO CHEMICAL CO., INC.) in one etching step, for example. Alternatively, dry etching can be employed to etch the lower conductive film (titanium) and the upper conductive film (aluminum) in one etching step.

Figure 4:
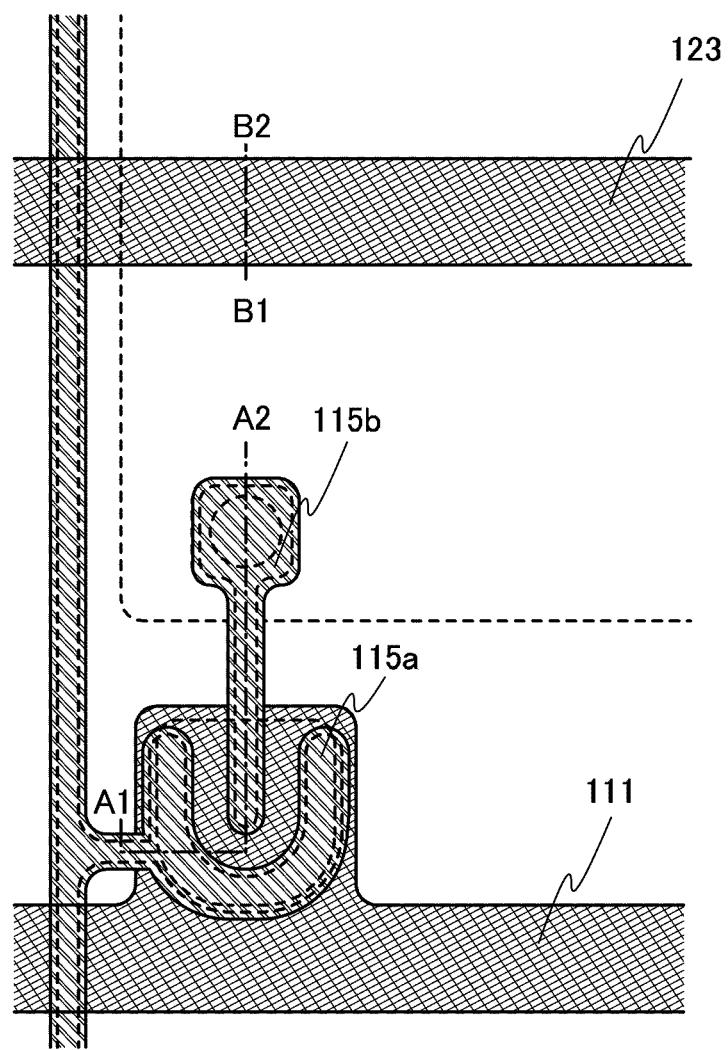
FIG. 4 illustrates a manufacturing method of a semiconductor device according to one embodiment of the present invention.

When the upper conductive film and the lower conductive film are etched in one etching step, the end portion of the first electrode layer 114a can be aligned with and continuous to the end portion of the first wiring layer 115a, and the end portion of the second electrode layer 114b can be aligned with and continuous to the end portion of the second wiring layer 115b. Alternatively, when wet etching is conducted, isotropically-etching is done so that the end portions of the first wiring layer 115a and the second wiring layer 115b are recessed from the resist masks 131. In addition, the cross-sectional view at this phase is illustrated in FIG. 2A, and the top view thereof where the resist masks 131 are removed is illustrated in FIG. 4.

Next, the same resist masks are used to conduct second etching. By the second etching, the first wiring layer 115a is recessed from the outer periphery (end portion) of the first electrode layer 114a and the second wiring layer 115b is recessed from the outer periphery (end portion) of the second electrode layer 114b. At this time, wet etching is employed.

For example, in a case where the upper conductive film, the 150-nm-thick aluminum film, formed over the lower conductive film, the 20-nm-thick titanium film, is etched to allow the upper conductive film to be recessed from the end portion of the lower electrode, the second etching is conducted for two minutes by using a second etchant obtained by heating at 45° C. a chemical in which phosphoric acid, acetic acid, nitric acid, and pure water are mixed at a ratio of 85:5:5:5 by vol % (in this specification, also referred to as an aluminum mixed acid solution). By the second etching, the upper conductive film can be recessed from the end portion of the lower electrode by about 2 μm.

Figure 5:
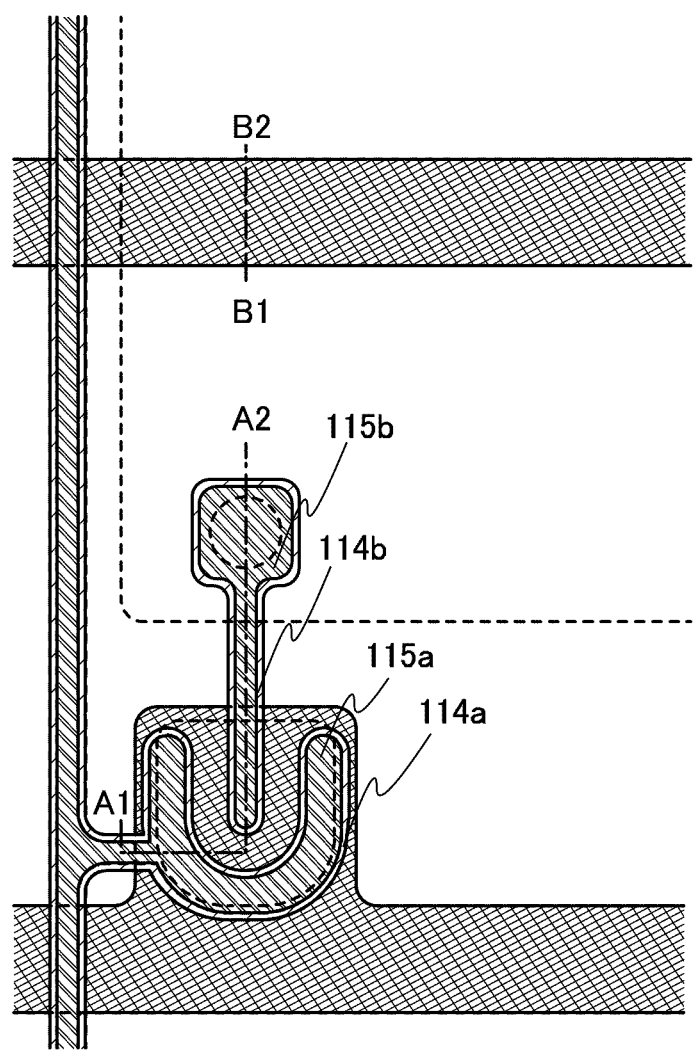
FIG. 5 illustrates a manufacturing method of a semiconductor device according to one embodiment of the present invention.

By etching in this manner, the end portion of the first wiring layer 115a is recessed from the end portion of the first electrode layer 114a, and the end portion of the second wiring layer 115b is recessed from the end portion of the second electrode layer 114b. As a result, the first electrode layer 114a extending outside from the end portion of the first wiring layer 115a and the second electrode layer 114b extending outside from the end portion of the second wiring layer 115b can be formed. Note that a resist mask for the second etching may be formed separately, although the first etching and the second etching are conducted using the resist masks 131 for simplification of the process. The first electrode layer 114a and the second electrode layer 114b serve a source electrode layer and a drain electrode of the thin film transistor, and the first wiring layer 115a and the second wiring layer 115b serve as signal lines. A cross-sectional view at this phase is illustrated in FIG. 2B. In addition, a top view at this phase corresponds to FIG. 5.

In addition, in this third photolithography process, a second terminal 122 is left in a terminal portion. Note that the second terminal 122 is formed using a part of a source wiring and electrically connected to the signal lines.

In addition, in the terminal portion, a connection electrode 120 is connected to the first terminal 118 of the terminal portion through a contact hole formed in the gate insulating film. Note that although not illustrated, a source or drain electrode and a gate electrode of the thin film transistor of the driver circuit are directly connected to each other through the same steps as the above-described steps.

Note that before forming an oxide semiconductor film 103 including a channel formation region, reverse sputtering by which plasma is generated by introduction of an argon gas in a chamber where the substrate 100 is provided is preferably performed, whereby dust attached to a surface of the gate insulating film is removed. By the reverse sputtering, planarity of the surface of the gate insulating film 102 can be improved. The reverse sputtering refers to a method in which, without application of a voltage to a target side, an RF power source is used for application of a voltage to a substrate side in an argon atmosphere to generate plasma for modifying a surface. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used. After the reverse sputtering, the oxide semiconductor film 103 is formed without being exposed to air, whereby dust or moisture can be prevented from attaching to an interface between the oxide semiconductor film 103 and the gate insulating film 102.

Next, the oxide semiconductor film 103 which will serve as the semiconductor layer 113 later is formed by a sputtering method without the surface of the gate insulating film 102 being exposed to air in an atmosphere of rare gas such as an argon gas and an oxygen gas. As the oxide semiconductor film 103, any of the oxide semiconductors described in Embodiment 1 can be used, and it is preferable to use an In—Ga—Zn—O-based oxide semiconductor.

Specifically, the oxide semiconductor film 103 is formed by a sputtering method under conditions that an oxide semiconductor target containing In, Ga, and Zn ($In_2O_3$:$Ga_2O_3$:ZnO=1:1:1) of 8 inches in diameter is used, the distance between the substrate and the target is 170 mm, a pressure is 0.4 Pa, a direct-current (DC) power source is 0.5 kW, a flow rate ratio of a film formation gas is Ar:$O_2$=50:5 (sccm), and the deposition temperature is room temperature. Further, as the target, $Ga_2O_3$ and ZnO in a pellet state may be disposed on a disk of 8 inches in diameter which contains $In_2O_3$. Note that the use of a pulsed direct-current (DC) power source is preferable, since dust can be reduced and thickness distribution can be evened. The thickness of the In—Ga—Zn—O-based non-single-crystal film is from 5 nm to 200 nm, preferably 20 nm to 60 nm. FIG. 2C is a cross-sectional view at this phase.

In the case where the In—Ga—Zn—O-based non-single-crystal film is formed by a sputtering method, an oxide semiconductor target including In, Ga, and Zn may be made to contain an insulating impurity. The impurity may be insulating oxide typified by silicon oxide, germanium oxide, or the like; insulating nitride typified by silicon nitride, or the like; insulating oxynitride such as silicon oxynitride; or the like. For example, $SiO_2$ is preferably mixed into the oxide semiconductor target at from 0.1 wt % to 10 wt %, more preferably from 1 wt % to 6 wt %.

When the insulating impurity is contained in the oxide semiconductor, the deposited oxide semiconductor can be made amorphous easily. Further, when the semiconductor layer 113 is subjected to heat treatment, crystallization of the oxide semiconductor layer 113 can be suppressed.

In addition to the In—Ga—Zn—O-based oxide semiconductor, a similar effect can be obtained by an In—Sn—Zn—O-based oxide semiconductor, an Sn—Ga—Zn—O-based oxide semiconductor, an In—Zn—O-based oxide semiconductor, an Sn—Zn—O-based oxide semiconductor, a Ga—Zn—O-based oxide semiconductor, an In—O-based oxide semiconductor, an Sn—O-based oxide semiconductor, and a Zn—O-based oxide semiconductor which each contain an insulating impurity.

For example, in a case where a film of an In—Sn—Zn—O-based oxide semiconductor to which silicon oxide is added is formed by a sputtering method, a target in which $In_2O_3$, $SnO_2$, ZnO, and $SiO_2$ are sintered at predetermined percentages is used. In addition, in a case of the In—Zn—O-based oxide semiconductor to which silicon oxide is added, a film is formed using a target in which $In_2O_3$, ZnO, and $SiO_2$ are sintered at predetermined percentages. In addition, in a case where a film of an Sn—Zn—O-based oxide semiconductor to which silicon oxide is added is formed by a sputtering method, a target in which $SnO_2$ and ZnO are mixed at predetermined percentages and $SiO_2$ is added at from 1 wt % to 10 wt %, preferably from 2 wt % to 8 wt % with respect to the total of $SnO_2$ and ZnO and sintered is used.

A chamber used for formation of the In—Ga—Zn—O-based non-single-crystal film may be the same as or different from the chamber in which the reverse sputtering has been performed.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is used mainly when an insulating film is formed, and a DC sputtering method is used mainly when a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus using an ECR sputtering in which plasma generated with use of microwaves instead of using glow discharge is used.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, a fourth photolithography process is performed to form a resist mask 132, and the In—Ga—Zn—O-based non-single-crystal film is etched. In the etching, organic acid such as citric acid or oxalic acid can be used for etchant. In this embodiment, an unnecessary portion of the In—Ga—Zn—O-based non-single-crystal film is removed by wet etching with use of ITO-07N (manufactured by Kanto Chemical Co., Inc.) to process the In—Ga—Zn—O-based non-single-crystal film into an island-like shape, so that the semiconductor layer 113 which is the In—Ga—Zn—O-based non-single-crystal film is formed. The end portion of the semiconductor layer 113 is etched into a tapered shape, whereby disconnection of a wiring due to a step shape can be prevented.

Note that the etching at this time may be dry etching, instead of wet etching. As an etching apparatus used for dry etching, an etching apparatus using a reactive ion etching method (an RIE method), or a dry etching apparatus using a high-density plasma source such as ECR (electron cyclotron resonance) or ICP (inductively coupled plasma) can be used. As a dry etching apparatus by which uniform electric discharge can be obtained over a wider area as compared to an ICP etching apparatus, there is an ECCP (enhanced capacitively coupled plasma) mode etching apparatus in which an upper electrode is grounded, a high-frequency power source of 13.56 MHz is connected to a lower electrode, and further a low-frequency power source of 3.2 MHz is connected to the lower electrode. This ECCP mode etching apparatus can be applied even when, as the substrate, a substrate of the tenth generation whose side is longer than about 3 meters, is used, for example.

Figure 6:
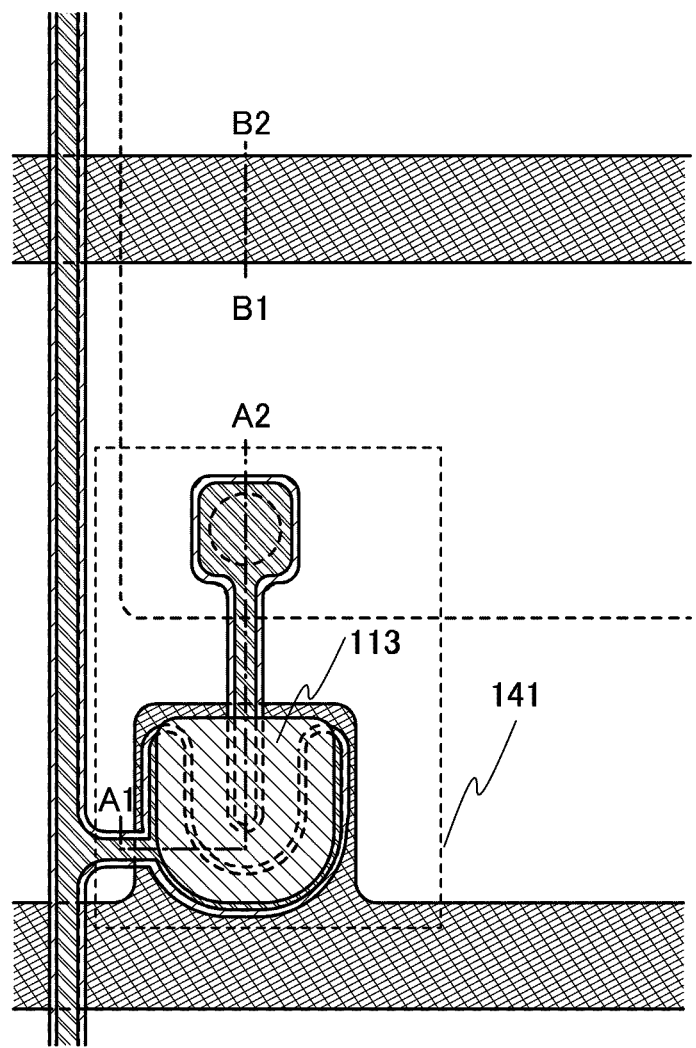
FIG. 6 illustrates a manufacturing method of a semiconductor device according to one embodiment of the present invention.

Through the above process, the thin film transistor 141 in which the semiconductor layer 113 is used for a channel formation region can be manufactured. A cross-sectional view at this phase is FIG. 3A. In addition, FIG. 6 is a top view at this phase.

Next, after the resist mask 132 is removed, heat treatment is preferably performed at 200° C. to 600° C., typically, 250° C. to 500° C. In this embodiment, heat treatment is performed under a nitrogen atmosphere in a furnace at 350° C. for 1 hour. Through this heat treatment, rearrangement at the atomic level occurs in the In—Ga—Zn—O-based non-single-crystal film. Because strain energy which inhibits carrier movement is released by the heat treatment, the heat treatment (including optical annealing) is effective. Note that there is no particular limitation on the timing of the heat treatment as long as it is performed after formation of the In—Ga—Zn—O based non-single-crystal film, and for example, the heat treatment may be performed after formation of a pixel electrode.

Further, the rear surface of the channel formation region of the semiconductor layer 113, so-called back channel, may be subjected to oxygen radical treatment. By the oxygen radical treatment, the thin film transistor can serve as a normally-off transistor. In addition, the radical treatment can repair damages of an exposed surface of the semiconductor layer 113. The radical treatment is preferably performed in an atmosphere of $O_2$ or $N_2O$, or preferably an atmosphere of $N_2$, He, or Ar each containing oxygen. Alternatively, the plasma treatment may be performed in an atmosphere in which $Cl_2$ and/or $CF_4$ are/is added to the above atmosphere. Note that the radical treatment is preferably performed with no bias applied.

Next, a protective insulating layer 109 is formed so as to cover the thin film transistor 141. The protective insulating layer 109 can be formed of a silicon nitride film, a silicon oxide film, a silicon oxynitride film, an aluminum oxide film, a tantalum oxide film or the like formed by a sputtering method.

Then, a fifth photolithography process is performed to form a resist mask, and the protective insulating layer 109 is etched to form a contact hole 125 that reaches the second wiring layer 115b. In addition, by the etching at this time, a contact hole 124 that reaches the second terminal 122 and a contact hole 126 that reaches the connection electrode 120 are also formed. A cross-sectional view after the resist mask is removed is illustrated in FIG. 3B.

Then, a transparent conductive film is formed. The transparent conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Etching treatment of such a material is performed with a hydrochloric acid based solution. Instead, because a residue tends to be generated particularly in etching of ITO, an alloy of indium oxide and zinc oxide ($In_2O_3$—ZnO) may be used in order to improve etching processability.

Next, a sixth photolithography process is performed to form a resist mask, and unnecessary portions are removed by etching, whereby a pixel electrode layer 128 is formed.

Further, in this sixth photolithography process, the capacitor wiring 123 and the pixel electrode layer 128 together form a storage capacitor with use of the gate insulating film 102 and the protective insulating layer 109 as dielectrics.

In addition, in this sixth photolithography process, the first terminal and the second terminal are covered with the resist mask, and transparent conductive films 127 and 129 are left in the terminal portion. The transparent conductive films 127 and 129 function as electrodes or wirings to be connected to an FPC. The transparent conductive film 129 formed over the connection electrode 120 that is directly connected to the first terminal 118 serves as a terminal electrode for connection which functions as an input terminal for the gate wiring. The transparent conductive film 127 formed over the second terminal 122 serves as a terminal electrode for connection which functions as an input terminal for the signal line.

Then, the resist mask is removed, and a cross-sectional view at this phase is illustrated in FIG. 3C. Note that a top view at this phase corresponds to FIG. 7.

Figure 8A:
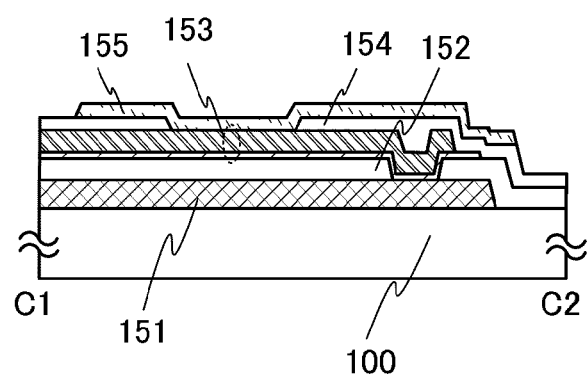
FIGS. 8A to 8D illustrate semiconductor devices according to one embodiment of the present invention.
Figure 8B:
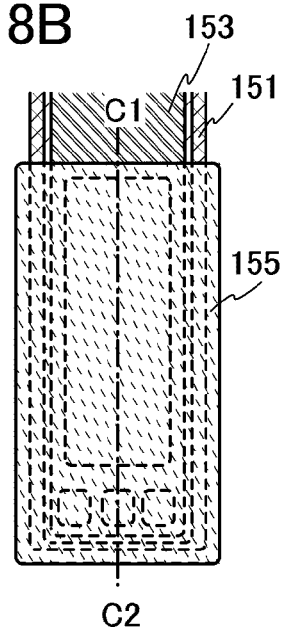

Further, FIGS. 8A and 8B are a cross-sectional view and a top view of a gate wiring terminal portion at this phase, respectively. FIG. 8A is the cross-sectional view taken along the line C1-C2 of FIG. 8B. In FIG. 8A, a transparent conductive film 155 formed over a protective insulating film 154 is a terminal electrode for connection which functions as an input terminal. Furthermore, in FIG. 8A, in the terminal portion, a first terminal 151 formed from the same material as the gate wiring and a connection electrode 153 formed from the same material as the signal line are in direct contact with each other to be electrically connected and overlapped through an opening portion provided in a gate insulating film 152 therebetween. In addition, the connection electrode 153 and the transparent conductive film 155 are in direct contact with each other to be electrically connected through a contact hole provided in the protective insulating film 154.

Figure 8C:
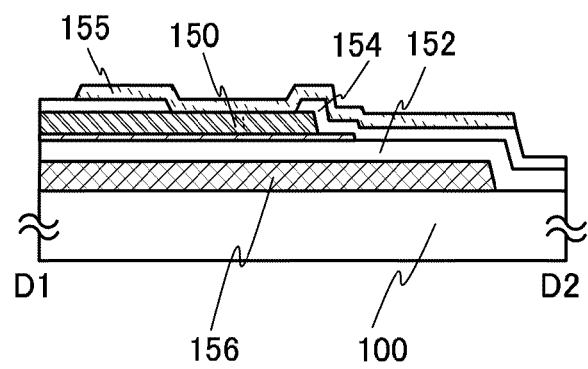
Figure 8D:
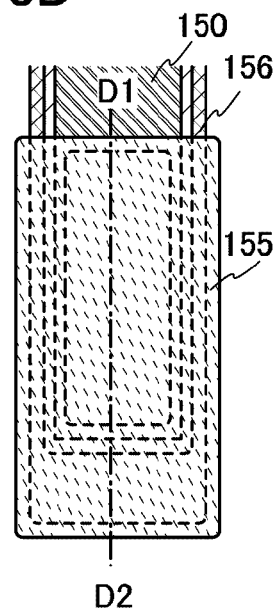

Further, FIGS. 8C and 8D are a cross-sectional view and a top view of a terminal portion of the signal line, respectively. In addition, FIG. 8C corresponds to a cross-sectional view taken along the line D1-D2 in FIG. 8D. In FIG. 8C, the transparent conductive film 155 formed over the protective insulating film 154 is a terminal electrode for connection which functions as an input terminal. Furthermore, in FIG. 8C, in the terminal portion, an electrode 156 formed from the same material as the gate wiring is located below and overlapped with a second terminal 150, which is electrically connected to the signal line, with the gate insulating film 152 therebetween. The electrode 156 is not electrically connected to the second terminal 150. When the electrode 156 is set to a potential different from the potential of the second terminal 150, for example, floating, GND, or 0 V, a capacitor for preventing noise or static electricity can be formed. In addition, the second terminal 150 is electrically connected to the transparent conductive film 155 with the protective insulating film 154 therebetween.

A plurality of gate wirings, signal lines, and capacitor wirings are provided depending on the pixel density. Also in the terminal portion, the first terminal at the same potential as the gate wiring, the second terminal at the same potential as the signal line, the third terminal at the same potential as the capacitor wiring, and the like are each arranged in plurality. The number of each of the terminals is optional and the number of the terminals may be determined by a practitioner as appropriate.

Through these six photolithography steps, the storage capacitor and a pixel thin film transistor portion including the thin film transistor 141 which is a bottom-gate n-channel thin film transistor can be completed using the six photomasks. By arranging the storage capacitors and pixel thin film transistor portions in a matrix corresponding to respective pixels to form a pixel portion, one of the substrates for manufacturing an active matrix display device can be obtained. In this specification, such a substrate is referred to as an active matrix substrate for convenience.

When an active matrix liquid crystal display device is manufactured, an active matrix substrate and a counter substrate provided with a counter electrode are bonded to each other with a liquid crystal layer therebetween. Note that a common electrode electrically connected to the counter electrode provided for the counter substrate is provided over the active matrix substrate, and a fourth terminal electrically connected to the common electrode is provided in the terminal portion. This fourth terminal is a terminal which fixes the common electrode to a predetermined potential such as GND or 0 V.

Figure 7:
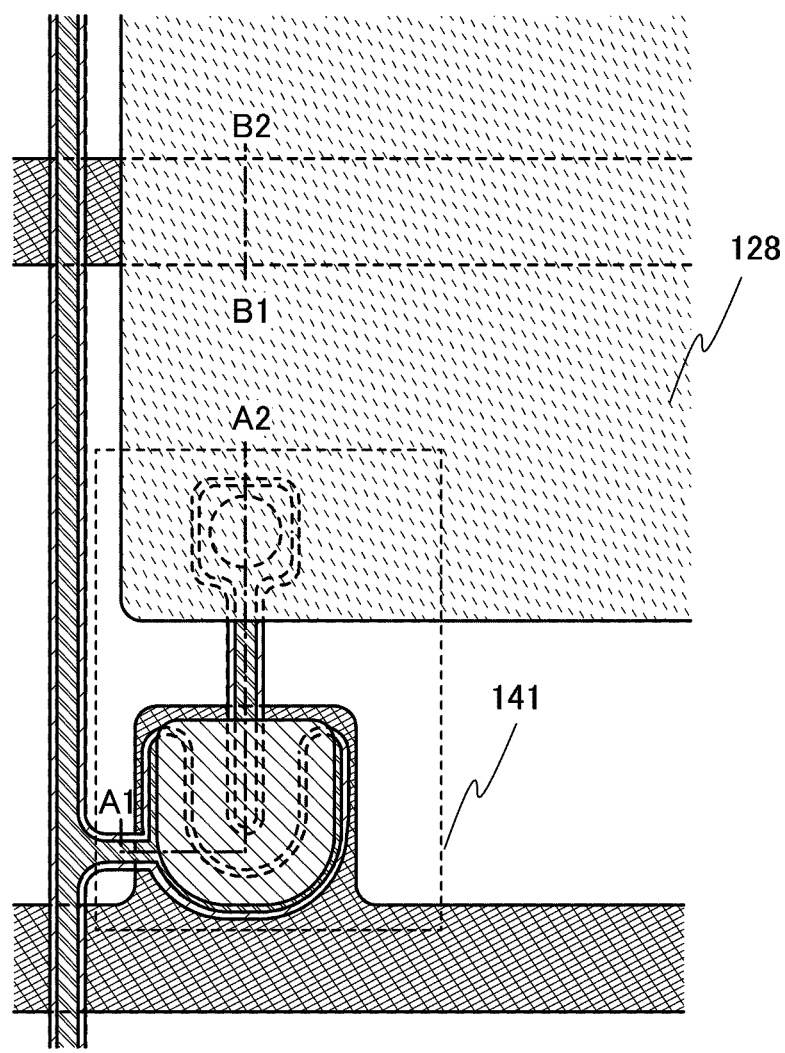
FIG. 7 illustrates a manufacturing method of a semiconductor device according to one embodiment of the present invention.
Figure 9:
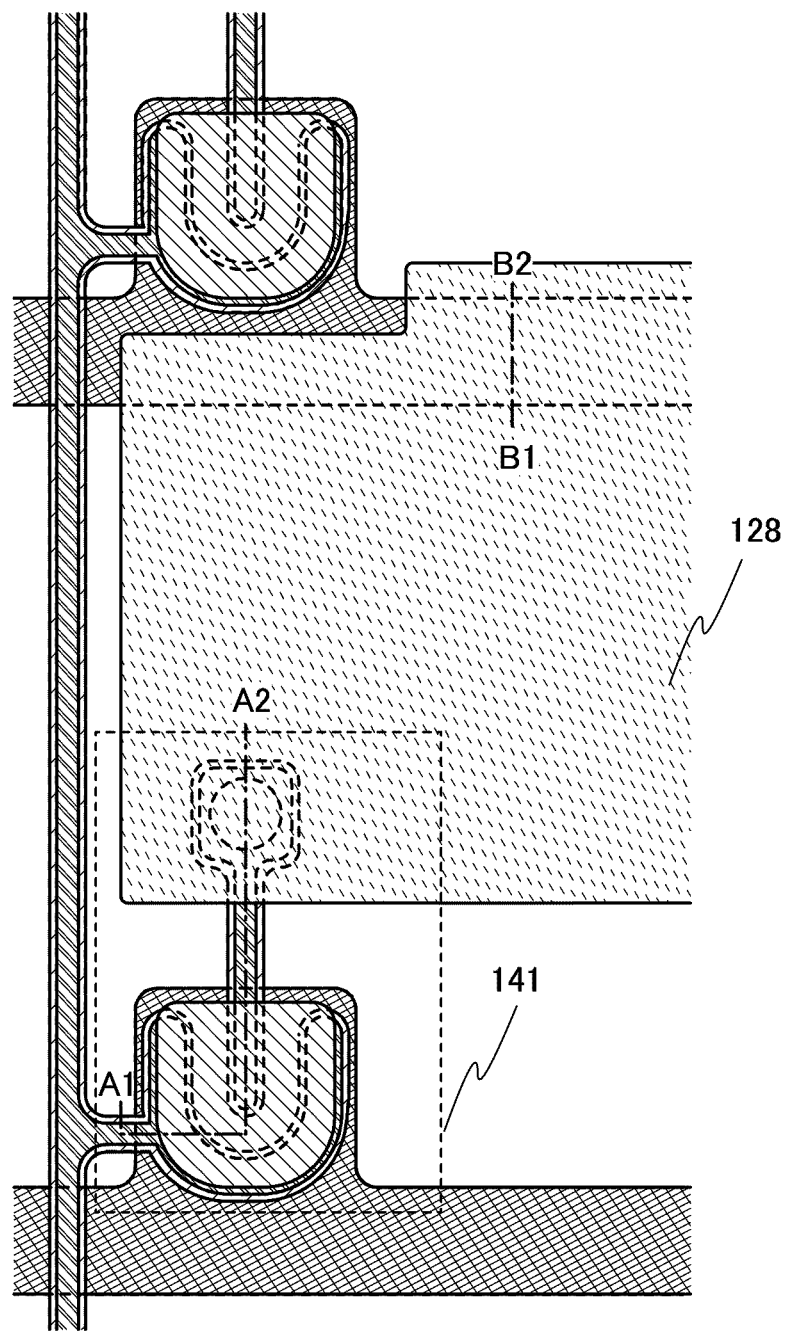
FIG. 9 illustrates a semiconductor device according to one embodiment of the present invention.

Further, this embodiment is not limited to the pixel structure in FIG. 7, and an example of a top view different from FIG. 7 is illustrated in FIG. 9. FIG. 9 illustrates an example in which a capacitor wiring is not provided and a storage capacitor is formed with a pixel electrode and a gate wiring of an adjacent pixel which are overlapped with each other with a protective insulating film and a gate insulating film therebetween. In this case, the capacitor wiring and the third terminal connected to the capacitor wiring can be omitted. Note that in FIG. 9, portions similar to those in FIG. 7 are denoted by the same reference numerals.

In an active matrix liquid crystal display device, display patterns are formed on a screen by driving pixel electrodes arranged in a matrix. In more detail, when voltage is applied between a selected pixel electrode and a counter electrode that corresponds to the selected pixel electrode, a liquid crystal layer provided between the pixel electrode and the counter electrode is optically modulated, and this optical modulation is recognized as a display pattern by an observer.

A liquid crystal display device has a problem in that liquid crystal molecules in displaying moving images takes a long time and thus afterimages or bluffing of moving images are caused. In order to improve the moving-image characteristics of such a liquid crystal display device, a driving method called black insertion is employed in which black is displayed on the whole screen every other frame period.

Alternatively, a driving method called double-frame rate driving may be employed, in which a vertical synchronizing frequency is 1.5-fold or more, or preferably, double or more to improve the moving-image characteristics.

Further, in order to improve the moving-image characteristics of a liquid crystal display device, a driving method may be employed in which a plurality of LEDs (light-emitting diodes) light sources or a plurality of EL light sources are used to form a surface light source as a backlight, and each light source of the surface light source is independently driven in a pulsed manner in one frame period. As the surface light source, three or more kinds of LEDs may be used and an LED for emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

When a light-emitting display device is manufactured, one electrode (also referred to as a cathode) of an organic light-emitting element is set to a low power supply potential such as GND or 0 V; therefore, a terminal portion is provided with a fourth terminal for setting the cathode to a low power supply potential such as GND or 0V. In addition, when a light-emitting display device is manufactured, a power supply line is provided in addition to a signal line and a gate wiring. Therefore, the terminal portion is provided with a fifth terminal electrically connected to the power supply line.

With the structure described above, carriers can move smoothly in the semiconductor layer covering the end portions of the source electrode layer and the drain electrode layer and at least a portion of steps existing in the end portions. Moreover, because the contact areas between the source electrode layer and the semiconductor layer including the channel formation region and between the drain electrode layer and the semiconductor layer are sufficiently large, the contact resistance is reduced and further hardly vary. Therefore, a thin film transistor having fewer variations in characteristics caused by the variation of the contact resistance can be provided. Further, the wirings connected to the source electrode layer and the drain electrode layer can be made thicker, and thus electric resistance of the wirings can be lowered.

Moreover, the thin film transistor obtained in this embodiment can have excellent characteristics and thus it can be used for a pixel portion and a driver circuit portion of a liquid crystal display device or a light-emitting display device. In addition, by combination with a liquid crystal display element or a light-emitting display element, a highly reliable display device having excellent electric characteristics can be provided.

Note that the structure described in this embodiment can be combined with any structure exemplified in the other embodiments as appropriate.

Embodiment 3

In Embodiment 3, a thin film transistor of a semiconductor device will be described. Specifically, a pixel portion of a display device having a top gate thin film transistor will be described.

Figure 10A:
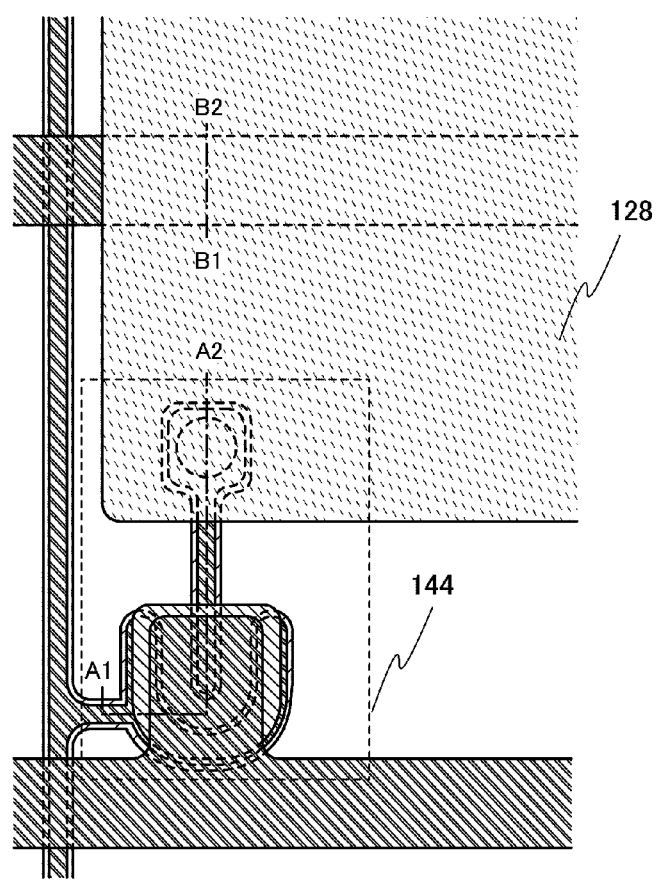
FIGS. 10A and 10B illustrate a semiconductor device according to one embodiment of the present invention.
Figure 10B:
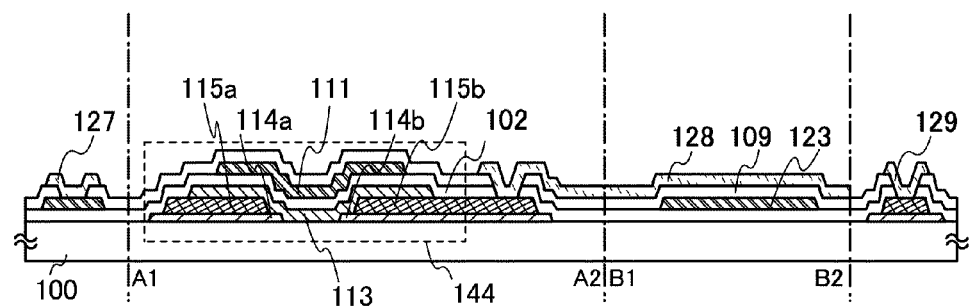

FIGS. 10A and 10B illustrate the thin film transistor of Embodiment 3. FIG. 10A is a top view and FIG. 10B is a cross-sectional view taken along the line A1-A2 and the line B1-B2 of FIG. 10A.

In a thin film transistor 144 illustrated in FIGS. 10A and 10B, the first electrode layer 114a and the second electrode layer 114b serving as the source electrode layer and the drain electrode layer are formed over the substrate 100. The first wiring layer 115a is provided over the first electrode layer 114a, the second wiring layer 115b is provided over the second electrode layer 114b, and the first electrode layer 114a and the second electrode layer 114b extend outside from the end portions of the first wiring layer 115a and the second wiring layer 115b, respectively. The semiconductor layer 113 is formed in contact with the side faces and the top faces of the first electrode layer 114a and the second electrode layer 114b. In addition, the gate insulating film 102 is formed over the semiconductor layer 113, and the gate electrode layer 111 is formed so as to overlap with end portions of the first electrode layer 114a and the second electrode layer 114b with the gate insulating film 102 between the gate electrode layer 111 and the first electrode layer 114a and between the gate electrode layer 111 and the second electrode layer 114b.

The first electrode layer 114a and the second electrode layer 114b are formed using the conductive film described in Embodiments 1 and 2 and in the similar manner thereto. In this embodiment, a 20-nm-thick titanium film is formed as the lower conductive film and is used for the first electrode layer 114a and the second electrode layer 114b.

In addition, the first wiring layer 115a and the second wiring layer 115b are also formed using the conductive film described in Embodiments 1 and 2, and in the similar manner thereto. In this embodiment, a 150-nm-thick aluminum film is formed as the upper conductive film and is used for the first wiring layer 115a and the second wiring layer 115b.

The semiconductor layer 113 is formed using the semiconductor film described in Embodiments 1 and 2 and in the similar manner thereto. In this embodiment, a 50-nm-thick In—Ga—Zn—O-based oxide semiconductor is used. The first electrode layer 114a and the second electrode layer 114b having a thickness of 20 nm is sufficiently thin and thus steps generated on the substrate are small. Further, the height of such steps are half of or less than that of the semiconductor layer 113 having a thickness of 50 nm, and thus the semiconductor layer 113 can favorably cover the end portions of the first electrode layer 114a and the second electrode layer 114b. As a result, hindrance to carrier movement, such as spaces, is not generated in the semiconductor layer 113 crossing over the steps.

The gate insulating film 102 formed over the semiconductor layer 113 and the gate electrode layer 111 overlapping with the end portions of the first electrode layer 114a and the second electrode layer 114b with the gate insulating film 102 therebetween can each be formed using any of materials described in Embodiments 1 and 2, and in the similar manner thereto.

With the structure described above, carriers can move smoothly in the semiconductor layer covering the end portions of the source electrode layer and the drain electrode layer and at least a portion of steps existing in the end portions. Moreover, because the contact areas between the source electrode layer and the semiconductor layer including the channel formation region and between the drain electrode layer and the semiconductor layer are sufficiently large, the contact resistance is reduced and further hardly vary. Therefore, a thin film transistor having fewer variations in characteristics caused by the variation of the contact resistance can be provided. Further, the wirings connected to the source electrode layer and the drain electrode layer can be made thicker, and thus electric resistance of the wirings can be lowered. Note that the structure described in this embodiment can be combined with any structure exemplified in the other embodiments as appropriate.

Embodiment 4

In Embodiment 4, an inverter circuit using two thin film transistors described in Embodiment 1 will be described.

A driver circuit for driving a pixel portion is formed using an inverter circuit, a capacitor, a resistor, and the like. When two n-channel TFTs are combined to form an inverter circuit, there are two types of combinations: a combination of an enhancement type transistor and a depletion type transistor (hereinafter, a circuit formed by such a combination is referred to as an EDMOS circuit) and a combination of enhancement type TFTs (hereinafter, a circuit formed by such a combination is referred to as an EEMOS circuit). Note that when the threshold voltage of the n-channel TFT is positive, the n-channel TFT is defined as an enhancement type transistor, while when the threshold voltage of the n-channel TFT is negative, the n-channel TFT is defined as a depletion type transistor, and this specification follows the above definitions.

The pixel portion and the driver circuit are formed over the same substrate. In the pixel portion, on/off of voltage application to pixel electrodes is switched using enhancement type transistors arranged in a matrix. In this embodiment, because the enhancement type transistors disposed in the pixel portion each include the semiconductor layer in which carriers can move smoothly even in the step portion over the source electrode layer and the drain electrode layer, and the contact areas between the source electrode layer and the semiconductor layer including the channel formation region and between the drain electrode layer and the semiconductor layer are sufficiently large, the contact resistance is reduced and further hardly vary. Therefore, a thin film transistor having fewer variations in characteristics caused by the variation of the contact resistance can be provided. Further, the wirings connected to the source electrode layer and the drain electrode layer can be made thicker, and thus electric resistance of the wirings can be lowered. Thus, the thin film transistors can be driven with lower power consumption.

Figure 11A:
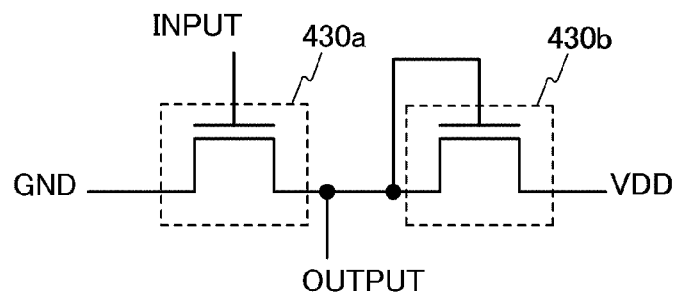
FIGS. 11A to 11C illustrate a semiconductor device according to one embodiment of the present invention.

Further, FIG. 11A illustrates an equivalent circuit of the EDMOS circuit. The circuit connection illustrated in FIGS. 11B and 11C corresponds to that illustrated in FIG. 11A. An example in which a first thin film transistor 430a is an enhancement-type n-channel transistor and a second thin film transistor 430b is a depletion-type n-channel transistor is illustrated.

In order to manufacture an enhancement-type n-channel transistor and a depletion-type n-channel transistor over the same substrate, for example, a first semiconductor layer 403a and a second semiconductor layer 403b are formed using different materials or under different conditions. Alternatively, an EDMOS circuit may be formed in such a manner that an oxide semiconductor is used as the semiconductor and gate electrodes are provided over and under the oxide semiconductor layer to control the threshold value and a voltage is applied to the gate electrodes so that one of the TFTs is normally on while the other TFT is normally off.

Alternatively, without limitation to the EDMOS circuit, an EEMOS circuit can be manufactured in such a manner that the first thin film transistor 430a and the second thin film transistor 430b are enhancement-type n-channel transistors. In that case, a third electrode layer 404c and a third wiring layer 405c are connected to a second gate electrode layer 401b instead of the connection of a second electrode layer 404b and a second wiring layer 405b with the second gate electrode layer 401b.

Figure 11B:
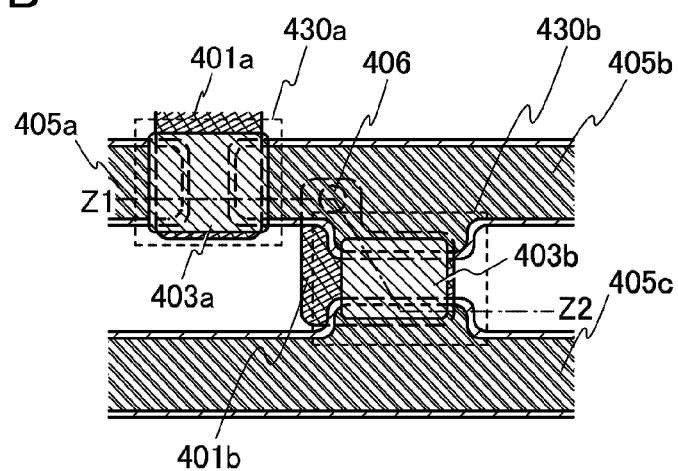

Further, FIG. 11B is a top view of the inverter circuit of the driver circuit. In FIG. 11B, a cross section taken along the chain line Z1-Z2 corresponds to FIG. 11C. Note that the first thin film transistor 430a and the second thin film transistor 430b illustrated in FIGS. 11A to 11C are inverted staggered thin film transistors according to one embodiment of the present invention.

Figure 11C:
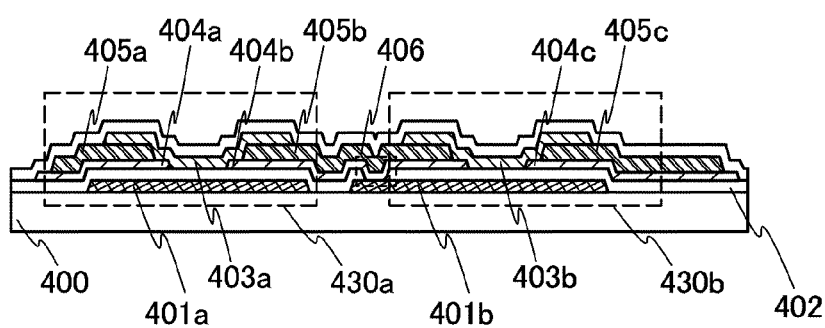

In the first thin film transistor 430a illustrated in FIG. 11C, a first gate electrode layer 401a is formed over a substrate 400, a gate insulating film 402 is formed over the first gate electrode layer 401a, and a first electrode layer 404a and the second electrode layer 404b serving as a source electrode layer and a drain electrode layer are formed over the gate insulating film 402. A first wiring layer 405a and the second wiring layer 405b are formed over the first electrode layer 404a and the second electrode layer 404b respectively, and the first electrode layer 404a and the second electrode layer 404b extend outside from end portions of the first wiring layer 405a and the second wiring layer 405b respectively. The first semiconductor layer 403a is formed in contact with side face portions and top face portions of the first electrode layer 404a and the second electrode layer 404b.

Similarly, in the second thin film transistor 430b, the second gate electrode layer 401b is formed over the substrate 400, the gate insulating film 402 is formed over the second gate electrode layer 401b, and the second electrode layer 404b and the third electrode layer 404c serving as a source electrode layer and a drain electrode layer are formed over the gate insulating film 402. The second wiring layer 405b and the third wiring layer 405c are formed over the second electrode layer 404b and the third electrode layer 404c respectively, and the second electrode layer 404b and the third electrode layer 404c extend outside from end portions of the second wiring layer 405b and the third wiring layer 405c respectively. The second semiconductor layer 403b is formed in contact with side face portions and top portions of the second electrode layer 404b and the third electrode layer 404c.

Here, the electrode layer 404b is directly connected to the second gate electrode layer 401b through a contact hole 406 formed in the gate insulating film 402. At least parts of the first semiconductor layer 403a and the second semiconductor layer 403b are provided in contact with a top surface of the gate insulating film 402. Note that as for the structures and materials of the respective portions, the thin film transistor described in Embodiment 2 is to be referred to.

The first wiring layer 405a is a power supply line at a ground potential (a ground power supply line). This power supply line at a ground potential may be a power supply line to which a negative voltage VDL is applied (a negative power supply line). The third wiring layer 405c is a power supply line to which a positive voltage VDD is applied (a positive power supply line).

As illustrated in FIG. 11C, the second electrode layer which is electrically connected to both the first semiconductor layer 403a and the second semiconductor layer 403b is directly connected to the second gate electrode layer 401b of the second thin film transistor 430b through the contact hole 406 formed in the gate insulating film 402. By the direct connection of the second electrode layer 404b with the second gate electrode layer 401b, the number of connection interfaces is reduced as compared with, for example, the case where connection is made by using a transparent conductive film, which leads to reduction in contact resistance. Further, the number of contact holes can be reduced, and thus the area for contact holes can be reduced.

With the structure described above, carriers can move smoothly in the semiconductor layer covering the end portions of the source electrode layer and the drain electrode layer and at least a portion of steps existing in the end portions. Moreover, because the contact areas between the source electrode layer and the semiconductor layer including the channel formation region and between the drain electrode layer and the semiconductor layer are sufficiently large, the contact resistance is reduced and further hardly vary. Therefore, a thin film transistor having fewer variations in characteristics caused by the variation of the contact resistance can be provided. Further, the wirings connected to the source electrode layer and the drain electrode layer can be made thicker, and thus electric resistance of the wirings can be lowered.

The inverter circuit using two thin film transistors having the structure described above has high reliability and can be driven with low power consumption.

Note that the structure described in this embodiment can be combined with any structure exemplified in the other embodiments as appropriate.

Embodiment 5

In Embodiment 5, an example of a display device which is one example of a semiconductor device will be described with reference to FIGS. 12A, 12B, FIG. 13. FIG. 14, FIG. 15, FIG. 16, and FIG. 17. In the display device, at least a portion of a driver circuit and thin film transistors to be disposed in a pixel portion are formed over the same substrate.

In addition, thin film transistors are each formed by using an In—Ga—Zn—O-based oxide for the semiconductor layer and are formed over the same substrate as at least a portion of a driver circuit, in the method similar to the method exemplified in any of the other embodiments. A portion of a driver circuit including n-channel TFTs of driver circuits is formed over the same substrate as the thin film transistors of the pixel portion.

Figure 12A:
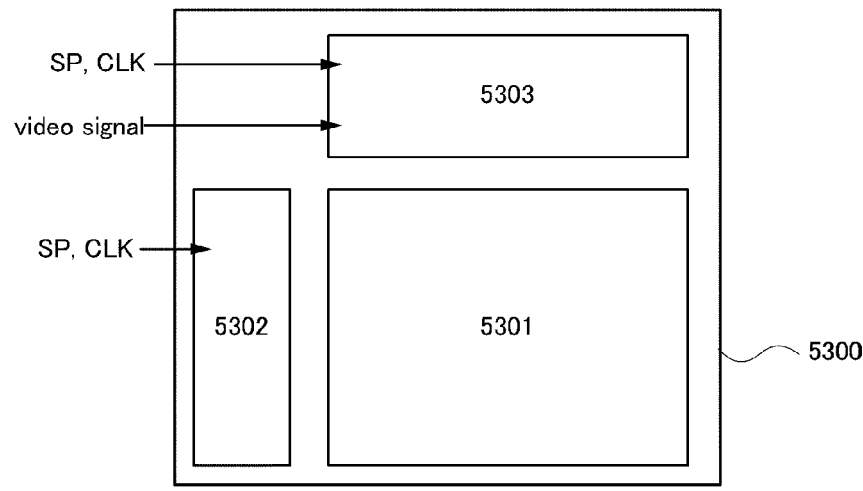
FIGS. 12A and 12B are block diagrams each illustrating a semiconductor device.

FIG. 12A illustrates an example of a block diagram of an active matrix liquid crystal display device which is an example of semiconductor devices. The display device illustrated in FIG. 12A includes, over a substrate 5300, a pixel portion 5301 including a plurality of pixels that are each provided with a display element; a scan line driver circuit 5302 that selects a pixel; and a signal line driver circuit 5303 that controls a video signal input to the selected pixel.

The pixel portion 5301 is connected to the signal line driver circuit 5303 by a plurality of signal lines 51 to Sm (not illustrated) which extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 also includes a plurality of pixels (not illustrated) arranged in matrix formed from the signal lines 51 to Sm and the scan lines G1 to Gn. Each pixel is connected to a signal line Sj (one of the signal lines 51 to Sm) and a scan line Gi (one of the scan lines G1 to Gn).

In addition, a signal line driver circuit including n-channel TFTs exemplified in any of Embodiments 1 to 3 will be described with reference to FIG. 13.

Figure 13:
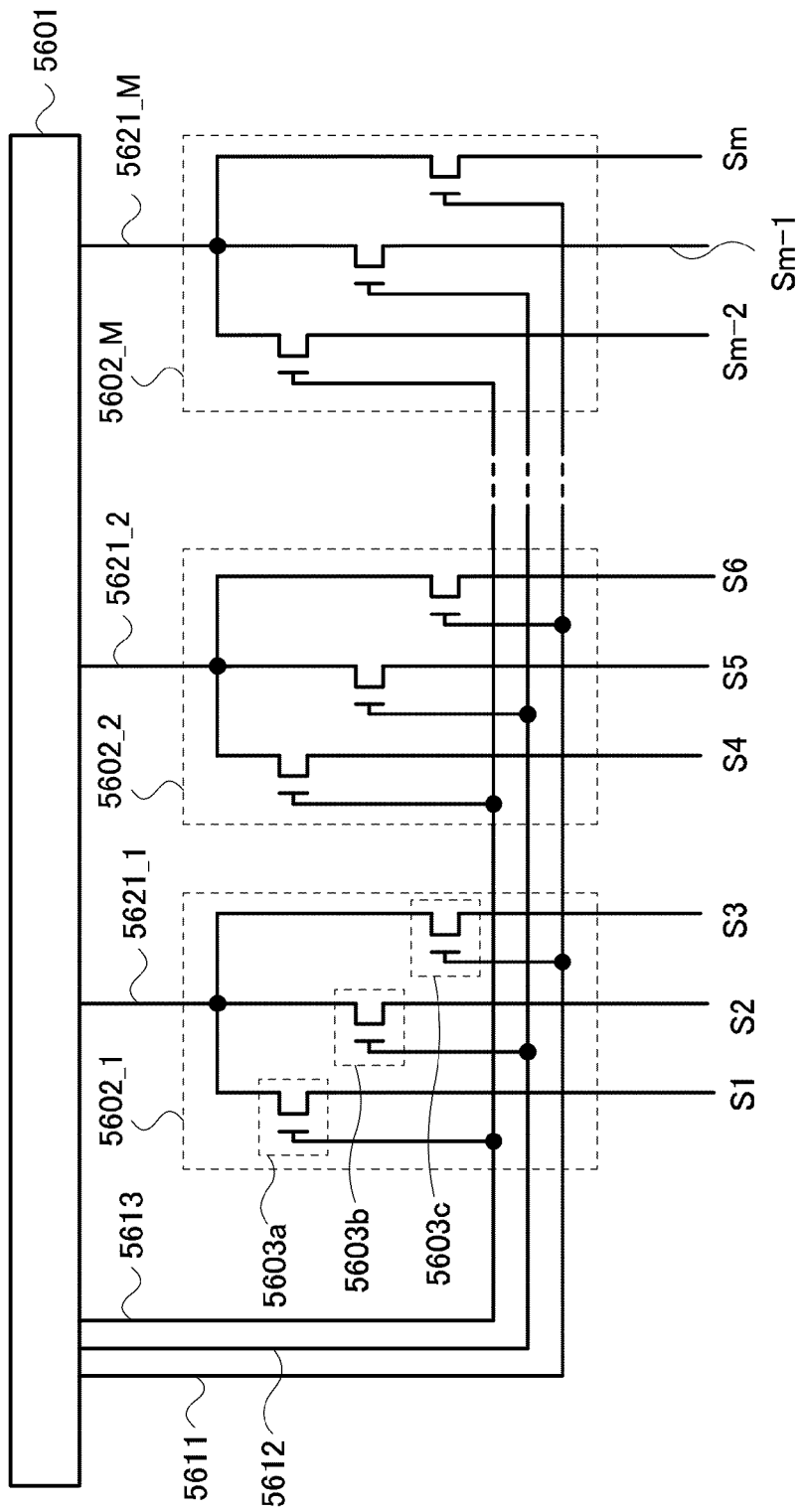
FIG. 13 illustrates a configuration of a signal line driver circuit.

The signal line driver circuit illustrated in FIG. 13 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, the third wiring 5613, and the wirings 5621_1 to 5621_M corresponding to the switch groups 5602_1 to 5602_M, respectively. Each of the wirings 5621_1 to 5621_M is connected to three signal lines (a signal line Sm-2, a signal line Sm-1, and a signal line Sm (m=3M)) via the first thin film transistor 5603a, the second thin film transistor 5603b, and the third thin film transistor 5603c. For example, a wiring 5621_J of the J-th column (any one of the wirings 5621_1 to 5621_M) is connected to a signal line Sj-2, a signal line Sj-1, and a signal line Sj (j=3 J) via the first thin film transistor 5603a, the second thin film transistor 5603b, and the third thin film transistor 5603c of a switch group 5602_J.

A signal is input to each of the first wiring 5611, the second wiring 5612, and the third wiring 5613.

Note that the driver IC 5601 is preferably formed using a single crystal semiconductor. Further, the switch groups 5602_1 to 5602_M are preferably formed over the same substrate as the pixel portion. Therefore, the driver IC 5601 and the switch groups 5602_1 to 5602_M are preferably connected through an FPC or the like. Alternatively, a single crystal semiconductor layer may be provided over the same substrate as the pixel portion by a method such as bonding to form the driver IC 5601.

Figure 14:
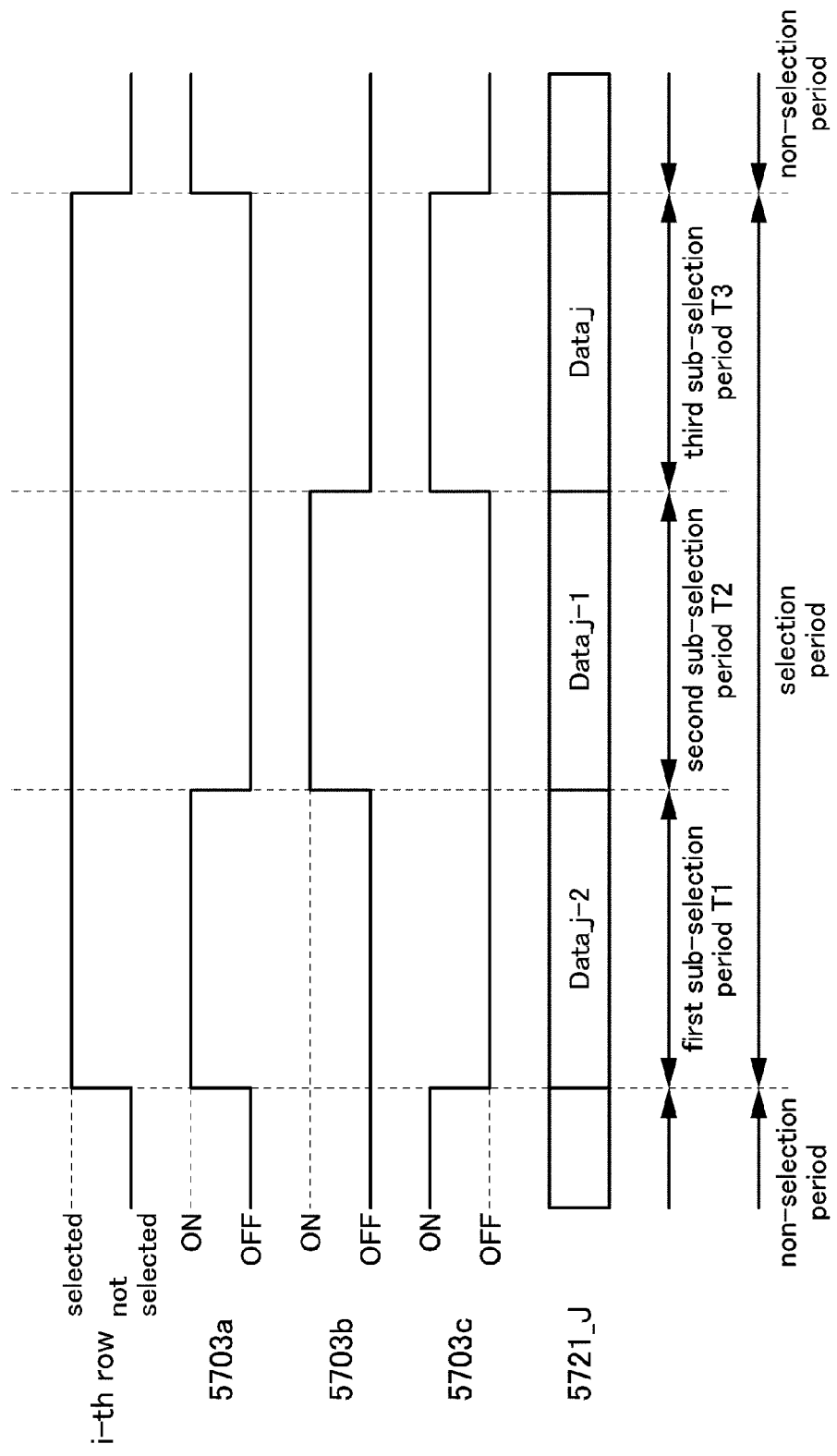
FIG. 14 is a timing chart illustrating operation of a signal line driver circuit.

Next, operation of the signal line driver circuit illustrated in FIG. 13 is described with reference to a timing chart in FIG. 14. The timing chart in FIG. 14 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 13 operates similarly to that in FIG. 14 even when a scan line of another row is selected.

Note that the timing chart in FIG. 14 shows a case where the wiring 5621_J of the J-th column is connected to the signal line Sj-2, the signal line Sj-1, and the signal line Sj via the first thin film transistor 5603a, the second thin film transistor 5603b, and the third thin film transistor 5603c, respectively.

The timing chart in FIG. 14 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj-2, a video signal input to the wiring 5621_J in the second sub-selection period T2 is input to the signal line Sj-1, and a video signal input to the wiring 5621_J in the third sub-selection period T3 is input to the signal line Sj. The video signals input to the wiring 5621_J in the first sub-selection period T1, the second sub-selection period T2, and the third sub-selection period T3 are denoted by Data_j-2, Data_j-1, and Data_j, respectively.

As illustrated in FIG. 14, in the first sub-selection period T1, the first thin film transistor 5603a is turned on, and the second thin film transistor 5603b and the third thin film transistor 5603c are turned off. At this time, Data_j-2 input to the wiring 5621_J is input to the signal line Sj-2 via the first thin film transistor 5603a. In the second sub-selection period T2, the second thin film transistor 5603b is turned on, and the first thin film transistor 5603a and the third thin film transistor 5603c are turned off. At this time, Data_j-1 input to the wiring 5621_J is input to the signal line Sj-1 via the second thin film transistor 5603b. In the third sub-selection period T3, the third thin film transistor 5603c is turned on, and the first thin film transistor 5603a and the second thin film transistor 5603b are turned off. At this time, Data_j input to the wiring 5621_J is input to the signal line Sj via the third thin film transistor 5603c.

As described above, in the signal line driver circuit in FIG. 13, by dividing one gate selection period into three, video signals can be input to three signal lines from one wiring 5621 in one gate selection period. Therefore, in the signal line driver circuit in FIG. 13, the number of connections between the substrate provided with the driver IC 5601 and the substrate provided with the pixel portion can be reduced to approximately ⅓ of the number of signal lines. The number of connections is reduced to approximately ⅓ of the number of the signal lines, so that reliability, yield, etc., of the signal line driver circuit in FIG. 13 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 13.

For example, when video signals are input to three or more signal lines from one wiring in three or more sub-selection periods, a thin film transistor and a wiring for controlling the thin film transistor may be added. Note that when one gate selection period is divided into four or more sub-selection periods, one sub-selection period becomes short. Therefore, one gate selection period is preferably divided into two or three sub-selection periods.

Figure 15:
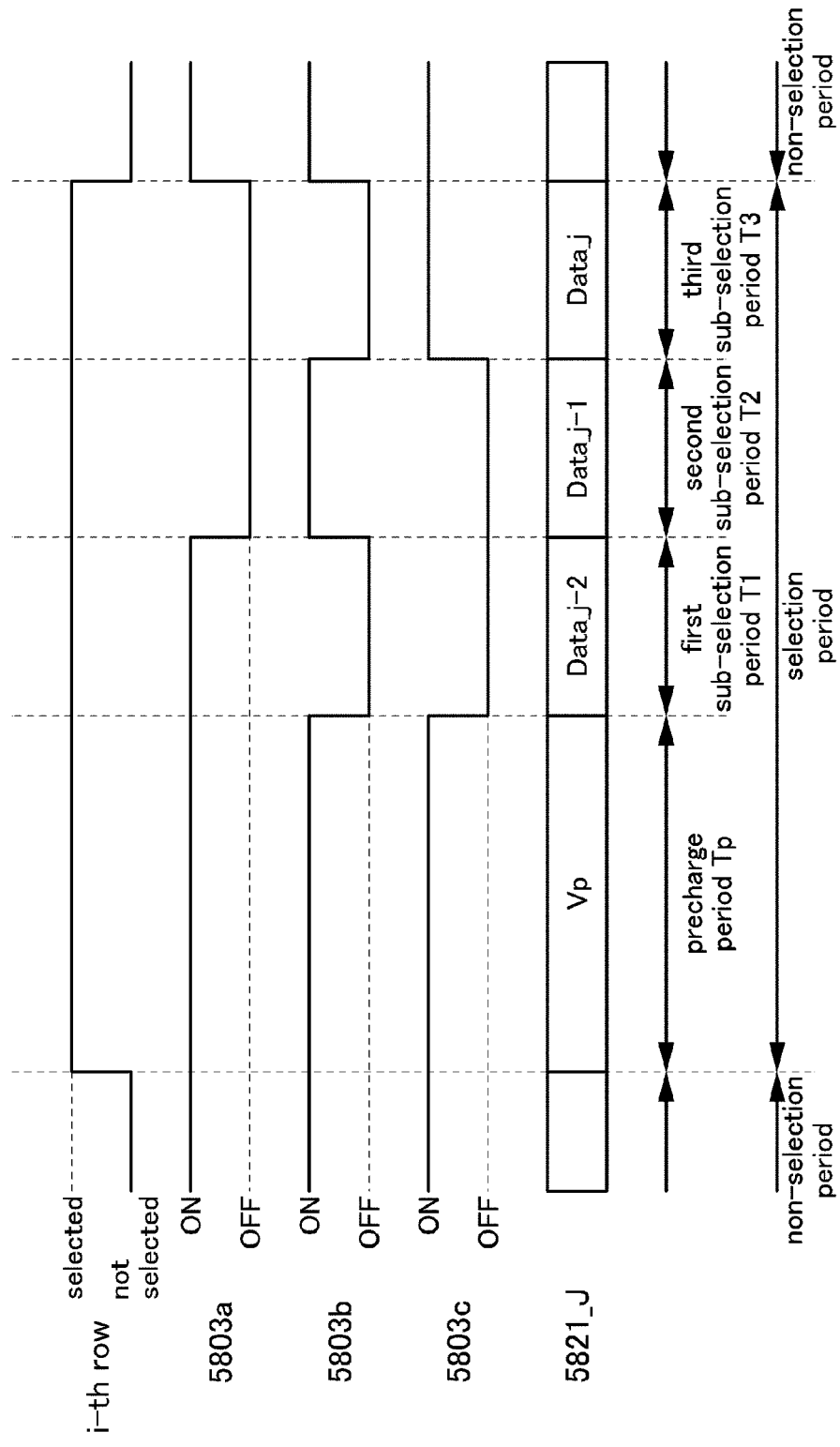
FIG. 15 is a timing chart illustrating operation of a signal line driver circuit.

As another example, one gate selection period may be divided into a precharge period Tp, the first sub-selection period T1, the second sub-selection period T2, and the third sub-selection period T3 as illustrated in a timing chart in FIG. 15. The timing chart in FIG. 15 illustrates timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 15, the first thin film transistor 5603a, the second thin film transistor 5603b, and the third thin film transistor 5603c are tuned on in the precharge period Tp. At this time, a pre-charge voltage $V_p$ input to the wiring 5621_J is input to each of the signal line Sj-2, the signal line Sj-1, and the signal line Sj via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j-2 input to the wiring 5621_J is input to the signal line Sj-2 via the first thin film transistor 5603a. In the second sub-selection period T2, the second thin film transistor 5603b is turned on, and the first thin film transistor 5603a and the third thin film transistor 5603c are turned off. At this time, Data_j-1 input to the wiring 5621_J is input to the signal line Sj-1 via the second thin film transistor 5603b. In the third sub-selection period T3, the third thin film transistor 5603c is turned on, and the first thin film transistor 5603a and the second thin film transistor 5603b are turned off. At this time, Data_j input to the wiring 5621_J is input to the signal line Sj via the third thin film transistor 5603c.

As described above, in the signal-line driver circuit of FIG. 13, to which the timing chart of FIG. 15 is applied, a signal line can be pre-charged by providing a pre-charge period before sub-selection periods. Thus, a video signal can be written to a pixel at high speed. Note that portions in FIG. 15 which are similar to those of FIG. 14 are denoted by common reference numerals and detailed description of the same portions and portions which have similar functions is omitted.

Further, a structure of a scan line driver circuit is described. The scan line driver circuit includes a shift register and a buffer. Also, a level shifter may be included in some cases. In the scan line driver circuit, when a clock signal (CLK) and a start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One mode of a shift register which is used for a part of a scan line driver circuit is described with reference to FIG. 16 and FIG. 17.

Figure 16:
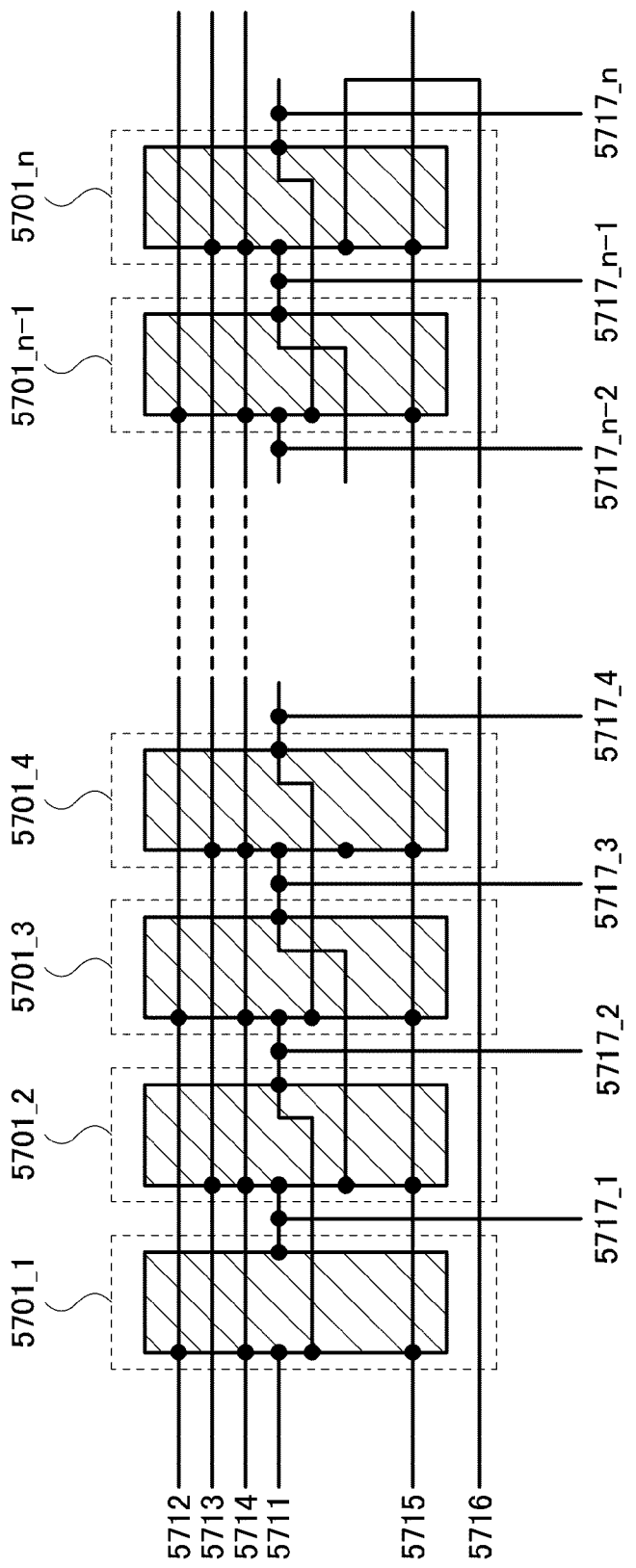
FIG. 16 illustrates a configuration of a shift register.

FIG. 16 illustrates a circuit configuration of the shift register. The shift register illustrated in FIG. 16 includes a plurality of flip-flops: flip-flops 5701_i to 5701_n. Further, the shift register operates in response to input of a first clock signal, a second clock signal, a start pulse signal, and a reset signal.

Connections in the shift register in FIG. 16 are described. The flip-flop 5701_1 of a first stage is connected to a first wiring 5711, a second wiring 5712, a fourth wiring 5714, a fifth wiring 5715, a seventh wiring 5717_1, and a seventh wiring 5717_2. The flip-flop 5701_2 of a second stage is connected to a third wiring 5713, the fourth wiring 5714, the fifth wiring 5715, the seventh wiring 5717_1, the seventh wiring 5717_2, and a seventh wiring 5717_3.

In a similar manner, a flip-flop 5701_i (any one of the flip-flops 5701_1 to 5701_n) of an i-th stage is connected to one of the second wiring 5712 and the third wiring 5713; the fourth wiring 5714; the fifth wiring 5715; a seventh wiring 5717_i−1; a seventh wiring 5717_i; and a seventh wiring 5717_i+1. Here, when the "i" is an odd number, the flip-flop 5701_i of the i-th stage is connected to the second wiring 5712; when the "i" is an even number, the flip-flop 5701_i of the i-th stage is connected to the third wiring 5713.

The flip-flop 5701_n of an n-th stage is connected to one of the second wiring 5712 and the third wiring 5713; the fourth wiring 5714; the fifth wiring 5715; a seventh wiring 5717_n−1; a seventh wiring 5717_n; and a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Figure 17:
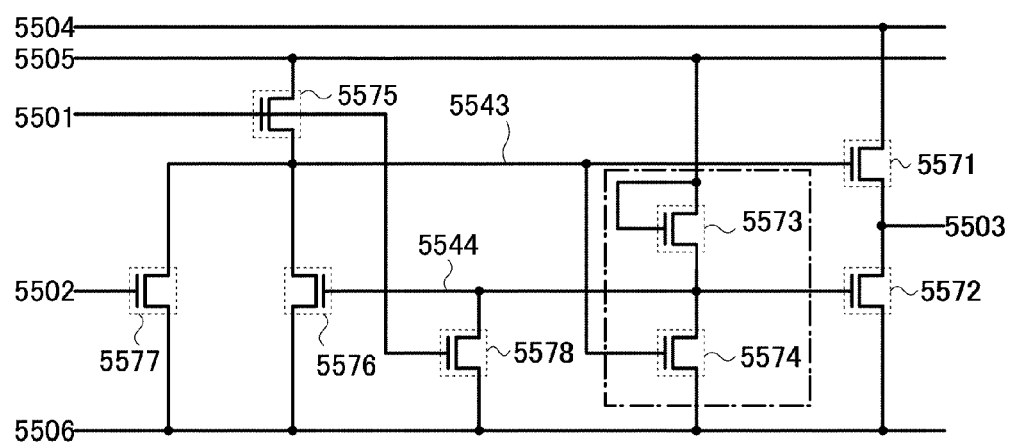
FIG. 17 illustrates connections in a structure of a flip flop according to one embodiment of the present invention.

Next, FIG. 17 illustrates details of the flip-flop illustrated in FIG. 16. The flip-flop illustrated in FIG. 17 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

In addition, the flip-flop illustrated in FIG. 17 includes a first wiring 5501, a second wiring 5502, a third wiring 5503, a fourth wiring 5504, a fifth wiring 5505, and a sixth wiring 5506.

Although the example in which all the thin film transistors are enhancement type n-channel transistors is described in this embodiment, there is no particular limitation. For example, the driver circuit can be driven even when n-channel depletion-mode transistors are used.

Now connections in the flip-flop shown in FIG. 17 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505, and a second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to a gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502.

A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In the flip-flop 5701_i of the i-th stage, the first wiring 5501 in FIG. 17 is connected to the seventh wiring 5717_i−1 in FIG. 16. The second wiring 5502 in FIG. 17 is connected to the seventh wiring 5717_i+1 in FIG. 16. The third wiring 5503 in FIG. 17 is connected to the seventh wiring 5717_i. The sixth wiring 5506 in FIG. 17 is connected to the fifth wiring 5715.

When the "i" is an odd number, the fourth wiring 5504 in FIG. 17 is connected to the second wiring 5712 in FIG. 16; when the "i" is an even number, the fourth wiring 5504 in FIG. 17 is connected to the third wiring 5713 in FIG. 16. In addition, the fifth wiring 5505 in FIG. 17 is connected to the fourth wiring 5714 in FIG. 16.

Note that in the flip-flop 5701_1 of the first stage, the first wiring 5501 in FIG. 17 is connected to the first wiring 5711 in FIG. 16. In addition, in the flip-flop 5701_n of the n-th stage, the second wiring 5502 in FIG. 17 is connected to the sixth wiring 5716 in FIG. 16.

Alternatively, the signal line driver circuit and the scan line driver circuit can be formed using only the n-channel TFTs exemplified in any of Embodiments 1 to 3. The n-channel TFT exemplified in any one of Embodiments 1 to 3 has high mobility, and thus a driving frequency of a driver circuit can be increased. Further, parasitic capacitance of the n-channel TFT exemplified in Embodiments 1 to 3 is reduced because of source and drain regions which are formed using an In—Ga—Zn—O-based non-single-crystal film; thus, frequency characteristics (referred to as f characteristics) of the n-channel TFT are high. For example, the scan line driver circuit including the n-channel TFTs exemplified in any of Embodiments 1 to 3 can operate at high speed; therefore, it is possible to increase the frame frequency or to achieve insertion of a black screen, for example.

In addition, when the channel width of each transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the other side; thus, an increase in frame frequency can be realized. Furthermore, the use of the plurality of scan line driver circuits for output of signals to the same scan line is advantageous in increasing the size of a display device.

Further, when an active matrix light-emitting display device which is an example of a semiconductor device is manufactured, a plurality of thin film transistors are arranged in at least one pixel, and thus a plurality of scan line driver circuits are preferably arranged. FIG. 12B is a block diagram illustrating an example of an active matrix light-emitting display device.

Figure 12B:
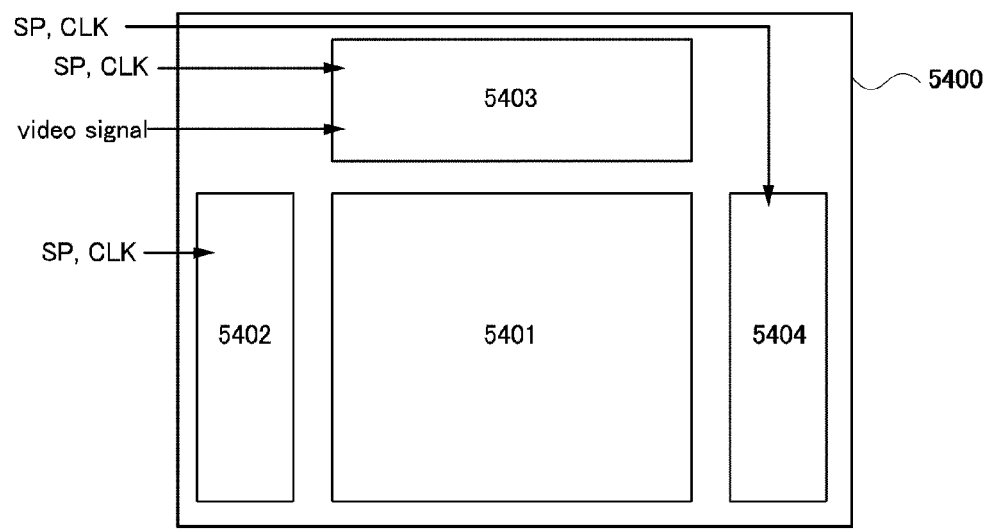

The light-emitting display device illustrated in FIG. 12B includes, over a substrate 5400, a pixel portion 5401 having a plurality of pixels each provided with a display element, a first scan line driver circuit 5402 and a second scan line driver circuit 5404 that select a pixel, and a signal line driver circuit 5403 that controls input of a video signal to the selected pixel.

When the video signal input to a pixel of the light-emitting display device illustrated in FIG. 12B is a digital signal, a pixel is in a light-emitting state or in a non-light-emitting state by switching of ON/OFF of the transistor. Thus, grayscale can be displayed using an area ratio grayscale method or a time ratio grayscale method. An area ratio grayscale method refers to a driving method for displaying grayscales by dividing one pixel into a plurality of subpixels and driving the respective subpixels separately based on video signals. Further, a time ratio grayscale method refers to a driving method for displaying grayscales by controlling a period during which a pixel is in a light-emitting state.

Since the response time of light-emitting elements is shorter than that of liquid crystal elements or the like, the light-emitting elements are more suitable for a time ratio grayscale method than the liquid crystal elements. Specifically, in the case of performing display with a time ratio grayscale method, one frame period is divided into a plurality of subframe periods. Then, in accordance with video signals, the light-emitting element in the pixel is set in a light-emitting state or a non-light-emitting state in each subframe period. By dividing one frame period into a plurality of subframe periods, the total length of time, in which a pixel actually emits light in one frame period, can be controlled by video signals so that grayscale can be displayed.

Note that in the example of the light-emitting display device shown in FIG. 12B, in a case where one pixel includes two switching TFTs, a signal which is input to a first scan line serving as a gate wiring of one of the switching TFTs is generated by the first scan line driver circuit 5402 and a signal which is input to a second scan line serving as a gate wiring of the other of the switching TFTs is generated by the second scan line driver circuit 5404. However, the signal which is input to the first scan line and the signal which is input to the second scan line may be generated together by one scan line driver circuit. In addition, for example, there is a possibility that a plurality of scan lines used for controlling the operation of the switching element are provided in each pixel, depending on the number of the switching TFTs included in one pixel. In this case, one scan line driver circuit may generate all signals that are input to the plurality of scan lines, or a plurality of scan line driver circuits may generate signals that are input to the plurality of scan lines.

Also in the light-emitting display device, a part of a driver circuit that can include n-channel TFTs among driver circuits can be formed over the same substrate as the thin film transistors of the pixel portion. Alternatively, the signal line driver circuit and the scan line driver circuit can be formed using only the n-channel TFTs exemplified in any of Embodiments 1 to 3.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (an electrophoretic display) and is advantageous in that it has the same level of readability as plain paper, it has lower power consumption than other display devices, and it can be made thin and lightweight.

A variety of modes of electrophoretic displays can be considered. The electrophoretic display is a device in which a plurality of microcapsules each including first particles having a positive charge and second particles having a negative charge are dispersed in a solvent or a solute, and an electrical field is applied to the microcapsules so that the particles in the microcapsules move in opposite directions from each other, and only a color of the particles gathered on one side is displayed. Note that the first particles or the second particles include a dye, and does not move when there is no electric field. Also, the color of the first particles is different from that of the second particles (the particles may also be colorless).

Thus, the electrophoretic display utilizes a so-called dielectrophoretic effect, in which a substance with high dielectric constant moves to a region with high electric field. An electrophoretic display does not need to use a polarizer, which is required in a liquid crystal display device, and both the thickness and weight of the electrophoretic display device can be a half of those of a liquid crystal display device.

A device in which such microcapsules are dispersed in a solvent is called electronic ink, and this electronic ink can be printed on a surface of glass, plastic, fabric, paper, or the like. Color display is also possible with use of a color filter or particles including a coloring matter.

In addition, when a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained using the thin film transistors which can be formed in a manner similar to that exemplified in any of the other embodiments can be used.

Note that the first particles and the second particles in the microcapsule may be formed of one of a conductive material, an insulating material, a semiconductor material, a magnetic material, a liquid crystal material, a ferroelectric material, an electroluminescent material, an electrochromic material, and a magnetophoretic material or a composite material thereof.

The display device exemplified in this embodiment includes the thin film transistors according to one embodiment of the present invention, and thus it has low power consumption and can be driven at higher speed.

Note that the structure described in this embodiment can be combined with any structure exemplified in the other embodiments as appropriate.

Embodiment 6

When the thin film transistors exemplified in any of Embodiments 1 to 3 are manufactured and used for a pixel portion and further for a driver circuit, a semiconductor device having a display function (also referred to as a display device) can be manufactured. Furthermore, when part or whole of a driver circuit using the thin film transistors exemplified in any of Embodiments 1 to 3 is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as an electronic ink, can be used.

In addition, the display device includes a panel in which the display element is sealed, and a module in which an IC or the like including a controller is mounted on the panel. One embodiment of the present invention also relates to an element substrate, which corresponds to one mode before the display element is completed in a manufacturing process of the display device, and the element substrate is provided with means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that the term "display device" in this specification means image display devices, display devices, or light sources (including lighting devices). Furthermore, the display device also includes the following modules in its category: for example, a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by chip on glass (COG).

In this embodiment, the appearance and a cross section of a liquid crystal display panel, which is one mode of the semiconductor device, will be described with reference to FIGS. 18A to 18C. FIGS. 18A and 18B are top views of a panel in which thin film transistors 4010 and 4011 with high reliability including the In—Ga—Zn—O-based non-single-crystal film as the oxide semiconductor layers exemplified in any of the other embodiments, and a liquid crystal element 4013 which are formed over a first substrate 4001, are sealed between the first substrate 4001 and a second substrate 4006 with a sealant 4005. FIG. 18C is a cross-sectional view taken along the line M-N of FIGS. 18A and 18B.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, between the first substrate 4001 and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and COG, wire bonding, TAB, or the like can be used. FIG. 18A illustrates an example of mounting the signal line driver circuit 4003 by COG, and FIG. 18B illustrates an example of mounting the signal line driver circuit 4003 by TAB.

The pixel portion 4002 and the scan line driver circuit 4004 provided over the first substrate 4001 each include a plurality of thin film transistors. FIG. 18C illustrates the thin film transistor 4010 included in the pixel portion 4002 and the thin film transistor 4011 included in the scan line driver circuit 4004. Insulating layers 4020 and 4021 are provided over the thin film transistors 4010 and 4011.

The highly reliable thin film transistor including In—Ga—Zn—O-based non-single-crystal films as the oxide semiconductor layers, exemplified in any of the other embodiments, can be used as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 therebetween.

Note that the first substrate 4001 and the second substrate 4006 can be made of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used. The counter electrode layer 4031 is electrically connected to a common potential line provided over the same substrate as the thin film transistor 4010. The counter electrode layer 4031 and the common potential line can be electrically connected to each other through conductive particles which are arranged between the pair of substrates using a common connection portion. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while the temperature of cholesteric liquid crystal is increased. Since the blue phase is only generated within a narrow range of temperature, a liquid crystal composition containing a chiral agent at 5 wt % or more is used in order to improve the temperature range, and thereby the liquid crystal layer 4008 is formed. The liquid crystal composition which includes a liquid crystal showing a blue phase and a chiral agent has a short response time of 10 μs to 100 μs, has optical isotropy, which makes the alignment process unneeded, and has a small viewing angle dependence.

Although an example of a transmissive liquid crystal display device is described in this embodiment, one embodiment of the present invention can also be applied to a reflective liquid crystal display device or a transflective liquid crystal display device.

In this embodiment, an example of the liquid crystal display device is shown in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked structure of the polarizing plate and the coloring layer is not limited to that illustrated in this embodiment and may be set as appropriate depending on materials of the polarizing plate and the coloring layer or conditions of manufacturing steps. Furthermore, a light-blocking film serving as a black matrix may be provided.

In this embodiment, in order to reduce the surface roughness of the thin film transistor and to improve the reliability of the thin film transistor, the thin film transistor exemplified in any of the other embodiments is covered with the insulating layers (the insulating layer 4020 and the insulating layer 4021) serving as a protective film or a planarizing insulating film. Note that the protective film is provided to prevent entry of impurities floating in air, such as an organic substance, a metal substance, or moisture, and is preferably a dense film. The protective film may be formed by a sputtering method, with a single layer film or a stacked structure of a silicon oxide film, a silicon nitride film, a silicon oxynitride film, a silicon nitride oxide film, an aluminum oxide film, an aluminum nitride film, an aluminum oxynitride film, and/or an aluminum nitride oxide film. Although in this embodiment, the example of forming the protective film by a sputtering method has been described, a variety of methods may be employed, without particular limitations.

In this embodiment, the insulating layer 4020 having a stacked structure is formed as the protective film. As a first layer of the insulating layer 4020, a silicon oxide film is formed by a sputtering method in this embodiment. The use of the silicon oxide film as the protective film has an effect of preventing a hillock of an aluminum film used for the source or drain electrode layers.

As a second layer of the insulating layer 4020, a silicon nitride film is formed by a sputtering method. The use of the silicon nitride film as the protective film can prevent mobile ions such as sodium ions from entering a semiconductor region and causing variations in electric characteristics of the TFT.

After the protective film is formed, the oxide semiconductor layer may be annealed (at 300° C. to 400° C.).

The insulating layer 4021 is formed as the planarizing insulating film. For the insulating layer 4021, an organic material having heat resistance, such as polyimide, acrylic, benzocyclobutene, polyamide, or epoxy, can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that a siloxane-based resin is a resin formed from a siloxane material as a starting material and having the bond of Si—O—Si. A siloxane-based resin may include as a substituent an organic group (e.g., an alkyl group or an aryl group) or a fluoro group. The organic group may include a fluoro group.

There is no particular limitation on the method for forming the insulating layer 4021, and the insulating layer 4021 can be formed, depending on a material used, by sputtering, SOG, spin coating, dipping, spray coating, droplet discharging (e.g., ink-jet, screen printing, or offset printing), doctor knife, roll coater, curtain coater, knife coater, or the like. In the case where the insulating layer 4021 is formed using a material solution, the oxide semiconductor layer may be annealed (at 300° C. to 400° C.) at the same time of a baking step. The baking step of the insulating layer 4021 also serves as the annealing step of the oxide semiconductor layer, whereby a semiconductor device can be manufactured efficiently.

The pixel electrode layer 4030 and the counter electrode layer 4031 can each be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the pixel electrode layer 4030 and the counter electrode layer 4031. The pixel electrode made of the conductive composition preferably has a sheet resistance of 10000 ohms per square or less and a transmittance of 70% or more at a wavelength of 550 nm. Furthermore, the resistivity of the conductive high molecule contained in the conductive composition is preferably 0.1 Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

In addition, a variety of signals and a potential are supplied to the signal line driver circuit 4003 that is formed separately, the scan line driver circuit 4004 and the pixel portion 4002 from an FPC 4018.

In this embodiment, a connecting terminal electrode 4015 is formed using the same conductive film as the pixel electrode layer 4030 included in the liquid crystal element 4013, and a terminal electrode 4016 is formed using the same conductive film as source or drain electrode layers of the thin film transistors 4010 and 4011.

The connecting terminal electrode 4015 is electrically connected to a terminal included in the FPC 4018 through an anisotropic conductive film 4019.

Note that FIGS. 18A to 18C illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 19:
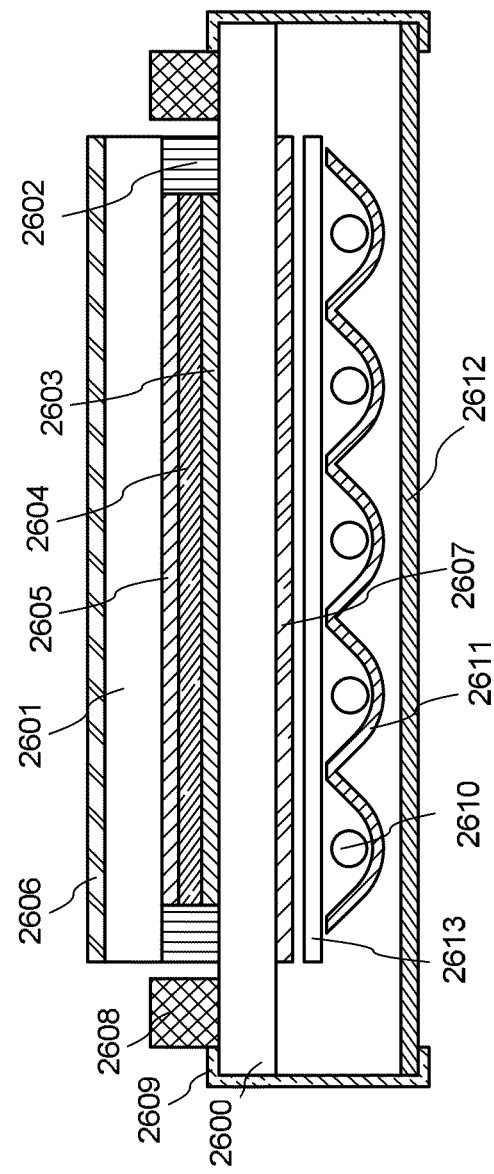
FIG. 19 illustrates a semiconductor device according to one embodiment of the present invention.

FIG. 19 illustrates an example of a liquid crystal display module which is formed as a semiconductor device by using a TFT substrate 2600 manufactured according to one embodiment of the present invention.

FIG. 19 illustrates an example of a liquid crystal display module, in which the TFT substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate therebetween.

Examples of modes of the liquid crystal display module include a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, and the like.

The liquid crystal panel exemplified in this embodiment includes the thin film transistors according to one embodiment of the present invention, and thus it has low power consumption and can be driven at higher speed.

Note that the structure described in this embodiment can be combined with any structure exemplified in the other embodiments as appropriate.

Embodiment 7

In Embodiment 7, an example of electronic paper is described as a semiconductor device to which the thin film transistors exemplified in any of the other embodiments are applied.

Figure 20:
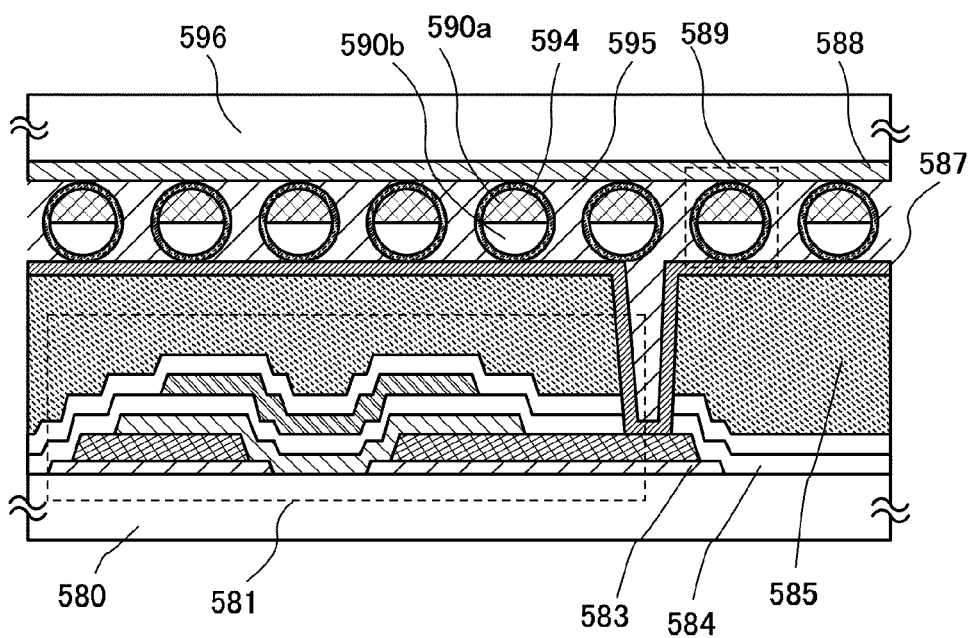
FIG. 20 illustrates a semiconductor device according to one embodiment of the present invention.

FIG. 20 illustrates active matrix electronic paper as an example of a semiconductor device. As a thin film transistor 581 used for the semiconductor device, the thin film transistor exemplified in any of the other embodiments can be applied.

The electronic paper in FIG. 20 is an example of a display device using a twisting ball display system. The twisting ball display system refers to a method in which spherical particles each colored in black and white are arranged between a first electrode layer and a second electrode layer, and a potential difference is generated between the first electrode layer and the second electrode layer to control orientation of the spherical particles, so that display is performed.

The thin film transistor 581 disposed between a substrate 580 and a substrate 596 is a thin film transistor with a top gate structure, and a source or drain electrode layer thereof is in contact with a first electrode layer 587 through an opening formed in insulating layers 583, 584, 585, whereby the thin film transistor 581 is electrically connected to the first electrode layer 587. Between the first electrode layer 587 and a second electrode layer 588, spherical particles 589 are provided. Each spherical particle 589 includes a black region 590$a$ and a white region 590$b$, and a cavity 594 filled with liquid around the black region 590$a$ and the white region 590$b$. The circumference of the spherical particle 589 is filled with filler 595 such as a resin (see FIG. 20). In this embodiment, the first electrode layer 587 corresponds to a pixel electrode, and the second electrode layer 588 corresponds to a common electrode. The second electrode layer 588 is electrically connected to a common potential line provided over the same substrate as the thin film transistor 581. The second electrode layer 588 and the common potential line can be electrically connected through conductive particles disposed between a pair of substrates using the common connection portion exemplified in any of the other embodiments.

Instead of the twisting ball, an electrophoretic element can also be used. A microcapsule having a diameter of approximately 10 μm to 20 μm, in which a transparent liquid, positively charged white microparticles and negatively charged black microparticles are encapsulated, is used. In the microcapsule that is provided between the first electrode layer and the second electrode layer, when an electric field is applied by the first electrode layer and the second electrode layer, the white microparticles and the black microparticles migrate to opposite sides to each other, so that white or black can be displayed. A display element using this principle is an electrophoretic display element, and is referred to as electronic paper in general. The electrophoretic display element has higher reflectivity than a liquid crystal display element; thus, an auxiliary light is unnecessary, less power is consumed, and a display portion can be recognized even in a dusky place. In addition, even when power is not supplied to the display portion, an image which has been displayed once can be maintained. Accordingly, a displayed image can be stored even if a semiconductor device having a display function (which may simply be referred to as a display device or a semiconductor device provided with a display device) is distanced from an electric wave source.

The electric paper exemplified in this embodiment includes the thin film transistors according to one embodiment of the present invention, and thus it has low power consumption and can be driven at higher speed.

Note that the structure described in this embodiment can be combined with any structure exemplified in the other embodiments as appropriate.

Embodiment 8

In Embodiment 8, an example of a light-emitting display device will be described as a semiconductor device to which the thin film transistors exemplified in any of the other embodiments are applied. As a display element included in a display device, a light-emitting element utilizing electroluminescence is described in this embodiment. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) are recombined, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an organic EL element is used as a light-emitting element in the description of this embodiment.

Figure 21:
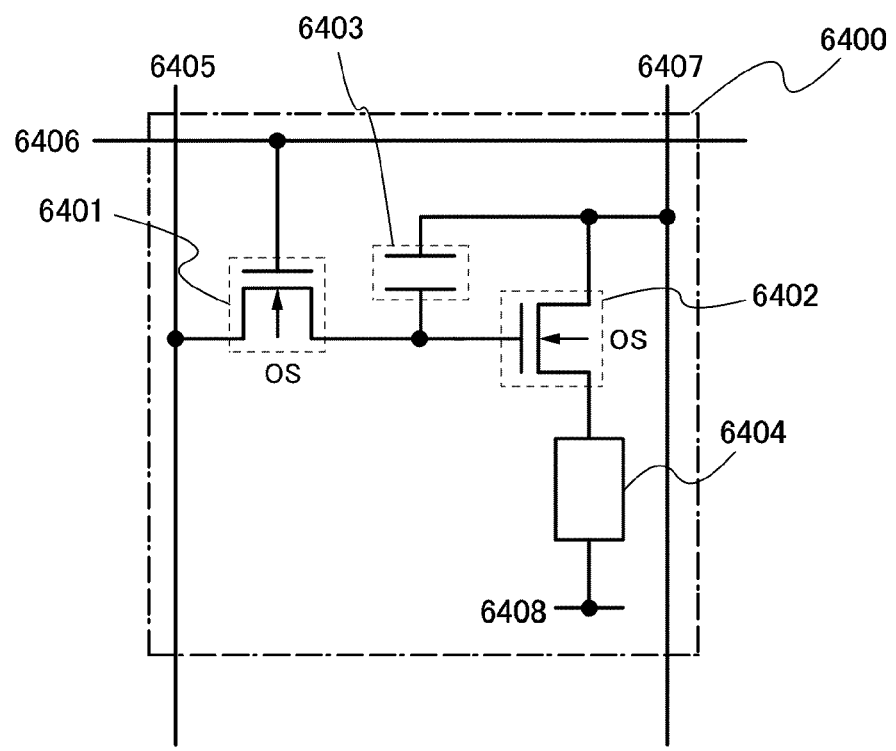
FIG. 21 illustrates an equivalent circuit of a semiconductor device according to one embodiment of the present invention.

FIG. 21 illustrates an example of a pixel structure which can be driven by a digital time grayscale method, as an example of a semiconductor device to which one embodiment of the present invention is applied.

The structure and operation of a pixel which can be driven by a digital time grayscale method will be described. In this embodiment, an example is described in which one pixel includes two n-channel transistors that use the oxide semiconductor layers (In—Ga—Zn—O non-single crystal film) exemplified in any of Embodiments 1 to 3 in their channel formation regions.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate, and the structure illustrated in FIG. 1A, FIG. 2A, or FIG. 3A may be obtained using the connection portion as a common connection portion.

Note that the second electrode (the common electrode 6408) of the light-emitting element 6404 is set to a low power supply potential. The low power supply potential is lower than a high power supply potential which is supplied to the power supply line 6407. For example, GND or 0 V may be set as the low power supply potential. The difference between the high power supply potential and the low power supply potential is applied to the light-emitting element 6404 to allow current to flow in the light-emitting element 6404, whereby the light-emitting element 6404 emits light. Thus, each potential is set so that the difference between the high power supply potential and the low power supply potential is higher than or equal to a forward threshold voltage of the light-emitting element 6404.

When the gate capacitor of the driving transistor 6402 is used as a substitute for the capacitor 6403, the capacitor 6403 can be omitted. The gate capacitor of the driving transistor 6402 may be formed between the channel region and the gate electrode.

In the case of using a voltage driving method by voltage input, a video signal is input to the gate of the driving transistor 6402 to make the driving transistor 6402 completely turn on or off. That is, the driving transistor 6402 operates in a linear region, and thus, a voltage higher than the voltage of the power supply line 6407 is applied to the gate of the driving transistor 6402. Note that a voltage higher than or equal to (power supply line voltage+$V_{th}$ of the driving transistor 6402) is applied to the signal line 6405.

In the case of using an analog grayscale method instead of the digital time grayscale method, the same pixel structure as that illustrated in FIG. 21 can be employed by inputting signals in a different way.

In the case of using the analog grayscale method, a voltage higher than or equal to (forward voltage of the light-emitting element 6404+$V_{th}$ of the driving transistor 6402) is applied to the gate of the driving transistor 6402. The forward voltage of the light-emitting element 6404 refers to a voltage to obtain a desired luminance, and includes at least a forward threshold voltage. By inputting a video signal to allow the driving transistor 6402 to operate in a saturation region, current can flow in the light-emitting element 6404. In order to allow the driving transistor 6402 to operate in the saturation region, the potential of the power supply line 6407 is higher than a gate potential of the driving transistor 6402. Since the video signal is an analog signal, a current in accordance with the video signal flows in the light-emitting element 6404, and the analog grayscale method can be performed.

Note that the pixel structure is not limited to that illustrated in FIG. 21. For example, the pixel in FIG. 21 can further include a switch, a resistor, a capacitor, a transistor, a logic circuit, and/or the like.

Next, structures of light-emitting elements will be described with reference to FIGS. 22A to 22C. A cross-sectional structure of a pixel will be described by taking an n-channel driving TFT as an example in this embodiment. Driving TFTs 7001, 7011, and 7021 used for semiconductor devices illustrated in FIGS. 22A to 22C are highly reliable thin film transistors using In—Ga—Zn—O-based non-single-crystal films as oxide semiconductors, which can be formed in a similar manner to the thin film transistors exemplified in any of Embodiments 1 to 3.

In order to extract light emitted from the light-emitting element, at least one of the anode and the cathode may be transparent. A thin film transistor and a light-emitting element are formed over a substrate. A light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure of one embodiment of the present invention can be applied to a light-emitting element having any of these emission structures.

A light-emitting element having a top emission structure will be described with reference to FIG. 22A.

Figure 22A:
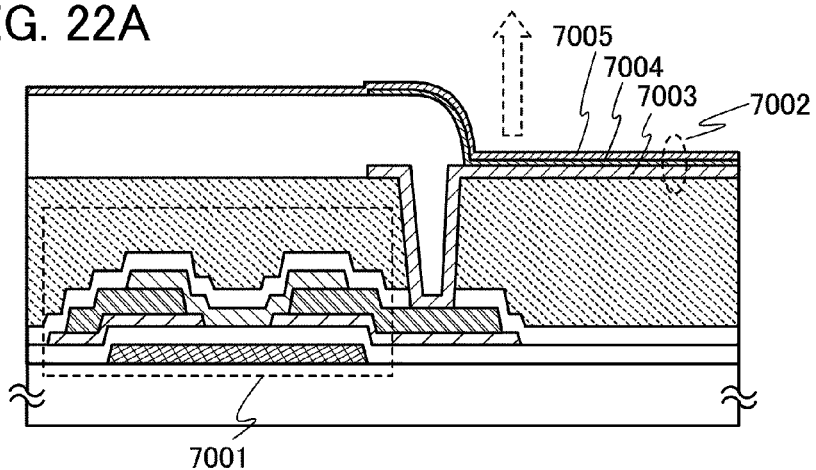
FIGS. 22A to 22C illustrate semiconductor devices according to one embodiment of the present invention.
Figure 22B:
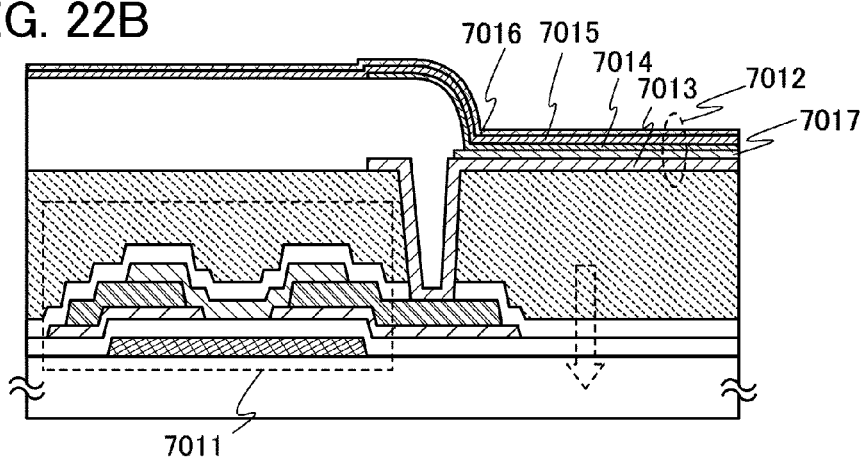
Figure 22C:
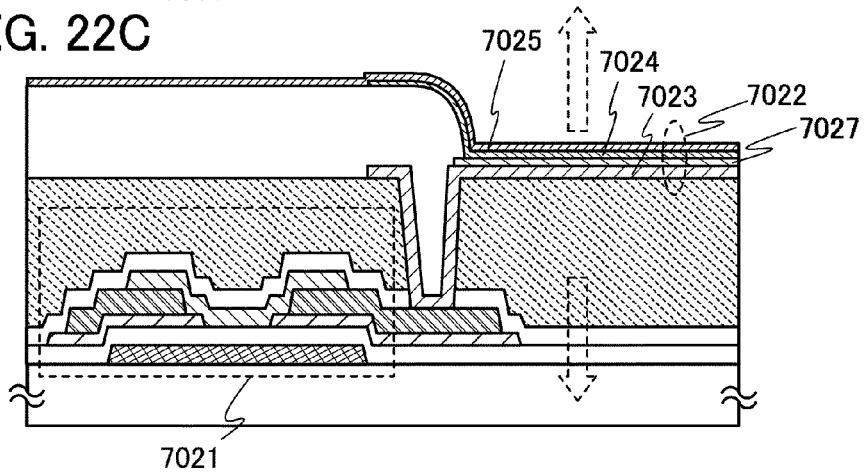

FIG. 22A is a cross-sectional view of a pixel in the case where the driving TFT 7001 is of an n-type and light generated in the light-emitting element 7002 is emitted to an anode 7005 side (the side opposite to the substrate) from the light-emitting layer 7004. In FIG. 22A, a cathode 7003 of the light-emitting element 7002 is electrically connected to the driving TFT 7001, and a light-emitting layer 7004 and the anode 7005 are stacked in this order over the cathode 7003. The cathode 7003 can be made of any of a variety of conductive materials as long as it has a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. Not all of these layers need to be provided. The anode 7005 is made of a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is interposed between the cathode 7003 and the anode 7005. In the pixel illustrated in FIG. 22A, light is emitted from the light-emitting element 7002 toward the anode 7005 side as indicated by the arrow.

Next, a light-emitting element having a bottom emission structure will be described with reference to FIG. 22B. FIG. 22B is a cross-sectional view of a pixel in the case where the driving TFT 7011 is of an n-type and light generated in a light-emitting element 7012 is emitted to a cathode 7013 side (to the substrate side) from a light-emitting layer. In FIG. 22B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, various conductive materials having a low work function can be used, like in the case of FIG. 22A. Note that the cathode 7013 is formed to a thickness that can transmit light (preferably, approximately 5 nm to 30 nm). For example, an aluminum film with a thickness of 20 nm can be used as the cathode 7013. Similarly to the case of FIG. 22A, the light-emitting layer 7014 may be formed using either a single layer or a plurality of layers stacked. The anode 7015 is not required to transmit light, but can be made of a light-transmitting conductive material like in the case of FIG. 22A. As the light-blocking film 7016, a metal which reflects light can be used for example; however, it is not limited to a metal film. For example, a resin to which black pigment is added can also be used.

The light-emitting element 7012 corresponds to a region where the light-emitting layer 7014 is interposed between the cathode 7013 and the anode 7015. In the pixel illustrated in FIG. 22B, light is emitted from the light-emitting element 7012 toward the cathode 7013 side as indicated by the arrow.

Next, a light-emitting element having a dual emission structure will be described with reference to FIG. 22C. In FIG. 22C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. Like in the case of FIG. 22A, the cathode 7023 can be made of any of a variety of conductive materials having a low work function. Note that the cathode 7023 is formed to a thickness that can transmit light. For example, a film of Al having a thickness of 20 nm can be used as the cathode 7023. Like in FIG. 22A, the light-emitting layer 7024 may be formed using either a single layer or a plurality of layers stacked. The anode 7025 can be made of a light-transmitting conductive material like in the case of FIG. 22A.

The light-emitting element 7022 corresponds to a region where the cathode 7023, the light-emitting layer 7024, and the anode 7025 overlap with one another. In the pixel illustrated in FIG. 22C, light is emitted from the light-emitting element 7022 toward both the anode 7025 side and the cathode 7023 side as indicated by the arrows.

Although the organic EL element is described as a light-emitting element in this embodiment, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

The structure of the semiconductor device described in this embodiment is not limited to those illustrated in FIGS. 22A to 22C and can be modified in various ways based on the spirit of techniques of the present invention.

Next, the appearance and a cross section of a light-emitting display panel (also referred to as a light-emitting panel) to which the thin film transistor exemplified in any of the other embodiments is applied will be described with reference to FIGS. 23A and 23B. FIG. 23A is a top view of a panel in which thin film transistors and a light-emitting element formed over a first substrate are sealed between the first substrate and a second substrate with a sealant. FIG. 23B is a cross-sectional view taken along the line H-I of FIG. 23A.

A sealant 4505 is provided to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. Preferably, the light-emitting display panel is thus packaged (sealed) with a protective film (such as a bonding film or an ultraviolet curable resin film) or a cover material with high air-tightness and little degasification so that the panel is not exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 23B.

Each of the thin film transistors 4509 and 4510 is a highly reliable thin film transistor using the In—Ga—Zn—O-based non-single-crystal film as its oxide semiconductor layer exemplified in any of the other embodiments. In this embodiment, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that a structure of the light-emitting element 4511 is not limited to the stacked structure described in this embodiment, which is a stack of the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition wall 4520 is made of an organic resin film, an inorganic insulating film, or organic polysiloxane. Preferably, the partition wall 4520 is formed of a photosensitive material to have an opening portion over the first electrode layer 4517 so that a sidewall of the opening portion is formed as an inclined surface with continuous curvature.

The electroluminescent layer 4512 may be formed with either a single layer or a plurality of layers stacked.

A protective film may be formed over the second electrode layer 4513 and the partition wall 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

In this embodiment, a connection terminal electrode 4515 is formed using the same conductive film as the first electrode layer 4517 included in the light-emitting element 4511, and a terminal electrode 4516 is formed using the same conductive film as the source and drain electrode layers included in the thin film transistors 4509 and 4510.

The connection terminal electrode 4515 is electrically connected to a terminal of the FPC 4518*a* through an anisotropic conductive film 4519.

The second substrate 4506 located in the direction in which light is extracted from the light-emitting element 4511 should have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

As needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce glare can be performed.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 23A and 23B.

The light-emitting display device exemplified in this embodiment includes the thin film transistors according to one embodiment of the present invention, and thus it has low power consumption and can be driven at higher speed.

Note that the structure described in this embodiment can be combined with any structure exemplified in the other embodiments as appropriate.

Embodiment 9

A display device of one embodiment of the present invention can be applied to electronic paper. The electronic paper can be used for electronic devices of a variety of fields that can display data. For example, the electronic paper can be applied to an electronic book (including e-book readers), a poster, an advertisement in a vehicle such as a train, or displays of various cards such as a credit card. Examples of the electronic devices are illustrated in FIGS. 24A and 24B and FIG. 25.

Figure 24A:
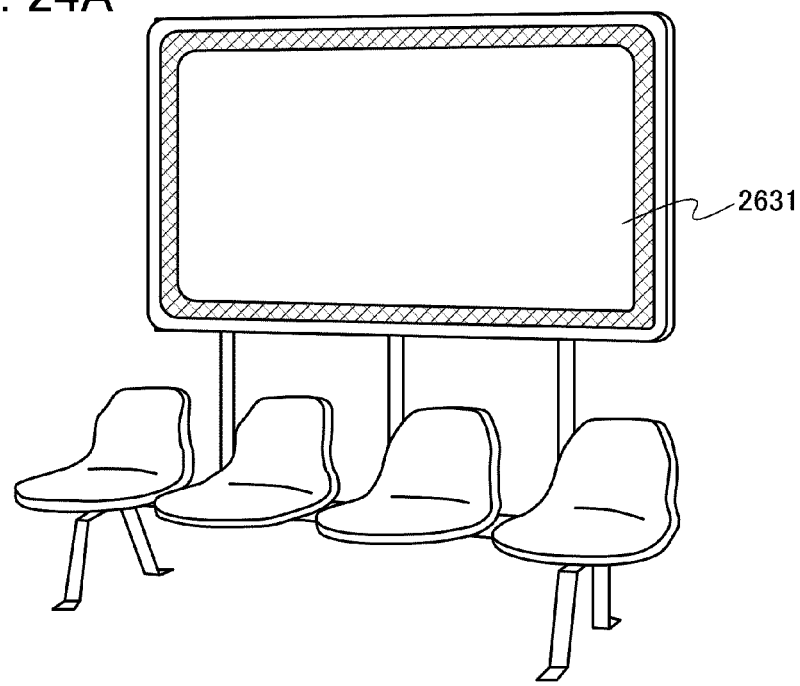
FIGS. 24A and 24B illustrate application examples of electronic paper.

FIG. 24A illustrates a poster 2631 using electronic paper. In the case where an advertising medium is printed paper, the advertisement is replaced by hands; however, by using electronic paper to which one embodiment of the present invention is applied, the advertising display can be changed in a short time. Furthermore, stable images can be obtained without display defects. Note that the poster may have a configuration capable of wirelessly transmitting and receiving data.

Figure 24B:
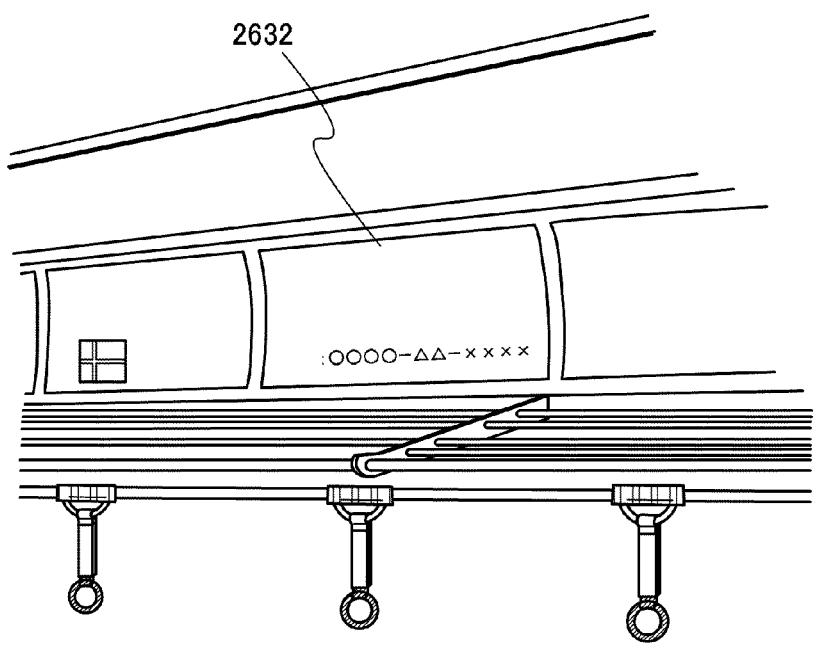

FIG. 24B illustrates an advertisement 2632 in a vehicle such as a train. In the case where an advertising medium is printed paper, the advertisement is replaced by hands; however, by using electronic paper to which one embodiment of the present invention is applied, the advertising display can be changed in a short time with less manpower. Furthermore, stable images can be obtained without display defects. Note that the advertisement in a vehicle may have a configuration capable of wirelessly transmitting and receiving data.

Figure 25:
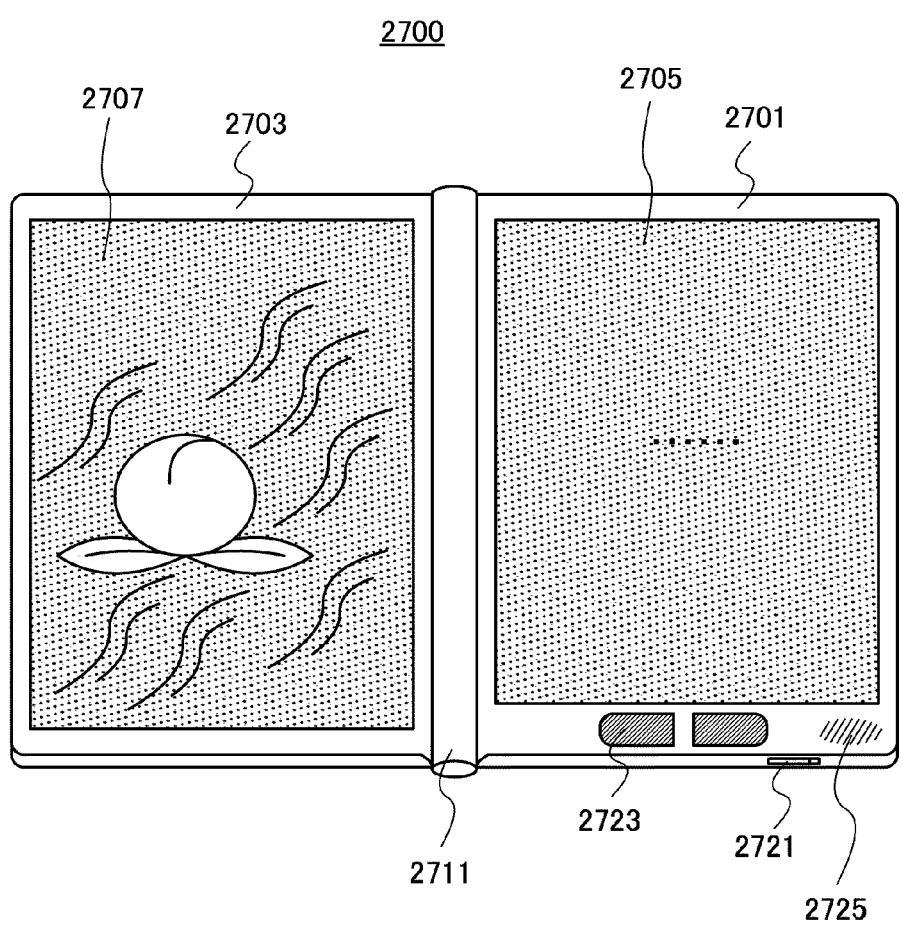
FIG. 25 is an external view illustrating an example of an electronic book.

FIG. 25 illustrates an example of an electronic book 2700. For example, the electronic book 2700 includes two housings: a housing 2701 and a housing 2703. The housing 2701 and the housing 2703 are unified with a hinge 2711 so that the electronic book 2700 can be opened and closed with the hinge 2711 as an axis. With such a structure, the electronic book 2700 can be operated like a paper book.

A display portion 2705 and a display portion 2707 are incorporated in the housing 2701 and the housing 2703, respectively. The display portion 2705 and the display portion 2707 may display one image together or different images from each other. When the display portion 2705 and the display portion 2707 display different images, for example, text data can be displayed on a display portion on the right side (the display portion 2705 in FIG. 25) and picture data can be displayed on a display portion on the left side (the display portion 2707 in FIG. 25).

FIG. 25 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book 2700 may have a function of an electronic dictionary.

The electronic book 2700 may have a configuration capable of wirelessly transmitting and receiving data. Through wireless communication, desired book data or the like can be purchased and downloaded from an electronic book server.

The display device exemplified in this embodiment includes the thin film transistors according to one embodiment of the present invention, and thus it has low power consumption and can be driven at higher speed.

Note that the structure described in this embodiment can be combined with any structure exemplified in the other embodiments as appropriate.

Embodiment 10

A semiconductor device according to one embodiment of the present invention can be applied to a variety of electronic devices (including amusement machines). Examples of electronic devices include television sets (also referred to as televisions or television receivers), monitors of computers and the like, cameras such as digital cameras or digital video cameras, digital photo frames, mobile phones (also referred to as cellular phones or mobile phone sets), portable game consoles, portable information terminals, audio reproducing devices, large-sized game machines such as pachinko machines, and the like.

Figure 26A:
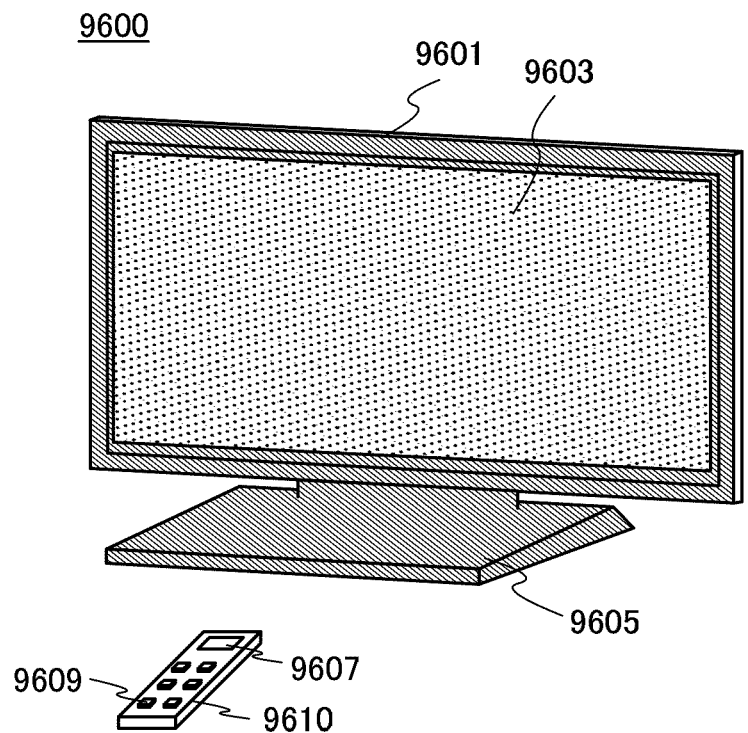
FIGS. 26A and 26B are external views illustrating a television set and a digital photo frame, respectively.

FIG. 26A illustrates an example of a television set 9600. In the television set 9600, a display portion 9603 is incorporated in a housing 9601. Images can be displayed on the display portion 9603. In this embodiment, the housing 9601 is supported by a stand 9605.

The television set 9600 can be operated by an operation switch of the housing 9601 or a separate remote controller 9610. Channels and volume can be controlled by operation keys 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 26B:
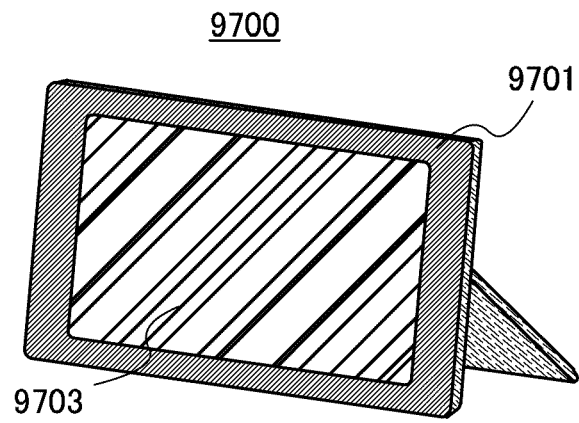

FIG. 26B illustrates an example of a digital photo frame 9700. For example, in the digital photo frame 9700, a display portion 9703 is incorporated in a housing 9701. Various images can be displayed on the display portion 9703. For example, the display portion 9703 can display data of a picture taken by a digital camera or the like, which can function as a normal photo frame.

Note that the digital photo frame 9700 is provided with an operation portion, an external connection portion (a USB terminal, a terminal that can be connected to various cables such as a USB cable, or the like), a recording medium insertion portion, and/or the like. Although they may be provided on the same surface as the display portion, it is preferable to provide them on the side surface or the back surface for the good design of the digital photo frame 9700. For example, a memory storing data of a picture taken by a digital camera is inserted in the recording medium insertion portion of the digital photo frame, whereby the image data can be transferred and displayed on the display portion 9703.

The digital photo frame 9700 may have a configuration capable of wirelessly transmitting and receiving data. Through wireless communication, desired image data can be transferred to be displayed.

Figure 27A:
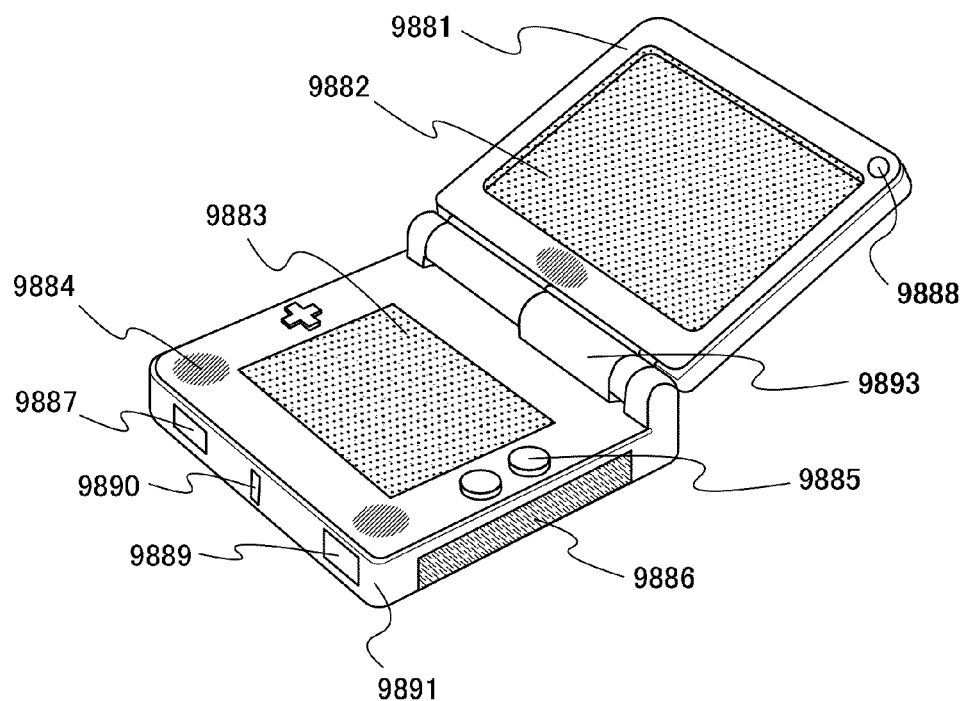
FIGS. 27A and 27B are external views illustrating examples of amusement machined.

FIG. 27A is a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 27A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and any of other structures provided with at least a semiconductor device according to one embodiment of the present invention may be employed. The portable amusement machine may include other accessory equipment as appropriate. The portable amusement machine illustrated in FIG. 27A has a function of reading a program or data stored in a recording medium to display it on the display portion, and a function of sharing information with another portable amusement machine by wireless communication. The portable amusement machine illustrated in FIG. 27A can have various functions without limitation to the above.

Figure 27B:
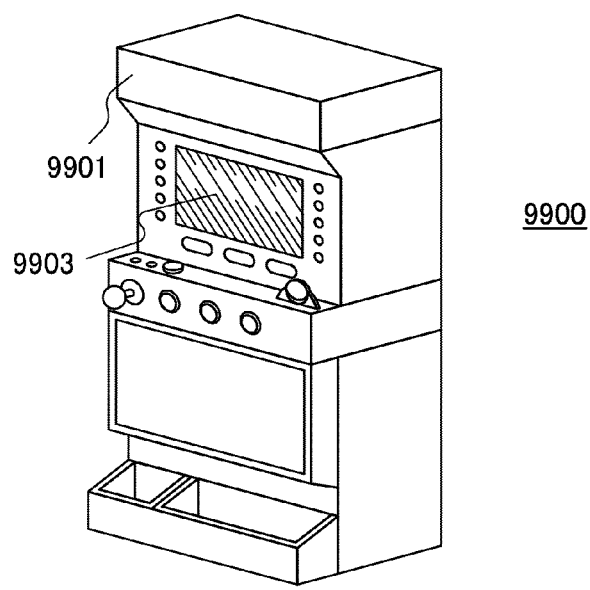

FIG. 27B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and any of other structures provided with at least a semiconductor device according to one embodiment of the present invention may be employed. The slot machine 9900 may include other accessory equipment as appropriate.

Figure 28:
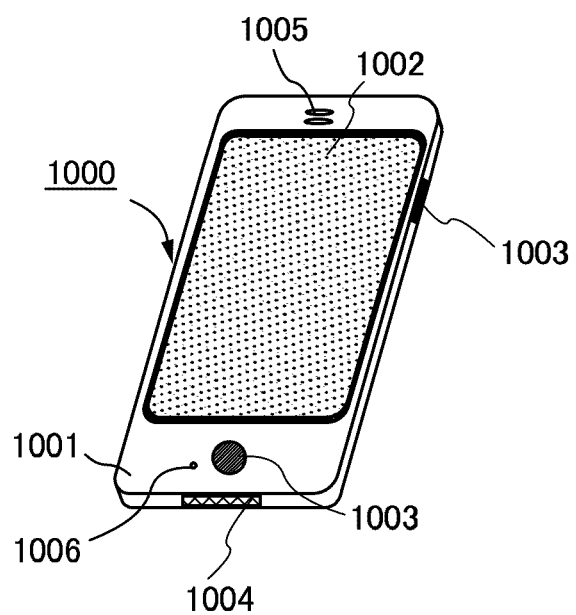
FIG. 28 is an external view illustrating a mobile phone.

FIG. 28 illustrates an example of a mobile phone 1000. The mobile phone 1000 is provided with a display portion 1002 incorporated in a housing 1001, operation buttons 1003, an external connection port 1004, a speaker 1005, a microphone 1006, and the like.

When the display portion 1002 of the mobile phone 1000 illustrated in FIG. 28 is touched with a finger or the like, data can be input into the mobile phone 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

When a detection device including a sensor for detecting inclination, such as a gyroscope or an acceleration sensor, is provided inside the mobile phone 1000, display on the screen of the display portion 1002 can be automatically switched by determining the direction of the mobile phone 1000 (whether the mobile phone 1000 is placed horizontally or vertically).

The screen mode is switched by touching the display portion 1002 or by operation with use of the operation buttons 1003 of the housing 1001. Alternatively, the screen mode may be switched depending on the kind of images displayed on the display portion 1002. For example, when a signal of an image displayed on the display portion is of moving image data, the screen mode is switched to the display mode. When the signal is of text data, the screen mode is switched to the input mode.

Furthermore, in the input mode, when input by touching the display portion 1002 is not performed for a certain period in a state that a signal is detected by the optical sensor in the display portion 1002, the screen mode may be controlled so as to be switched from the input mode to the display mode.

The display portion 1002 may function as an image sensor. For example, an image of a palm print, a fingerprint, or the like is taken by touching the display portion 1002 with the palm or the finger, whereby personal authentication can be performed. Furthermore, by providing a backlight or sensing light source emitting a near-infrared light for the display portion, an image of a finger vein, a palm vein, or the like can also be taken.

The electronic devices exemplified in this embodiment each include the thin film transistors according to one embodiment of the present invention, and thus they have low power consumption and can e driven at higher speed.

Note that the structure described in this embodiment can be combined with any structure exemplified in the other embodiments as appropriate.

This application is based on Japanese Patent Application serial No. 2009-042575 filed with Japan Patent Office on Feb. 25, 2009, the entire contents of which are hereby incorporate by reference.

What is claimed is:

1. A semiconductor device comprising:
a gate electrode layer;
a gate insulating film over the gate electrode layer;
a first electrode layer and a second electrode layer whose end portions overlap with the gate electrode layer, over the gate insulating film;
a first wiring layer over the first electrode layer;
a second wiring layer over the second electrode layer; and
an oxide semiconductor layer over the gate electrode layer,
wherein the first electrode layer extends beyond an end portion of the first wiring layer,
wherein the second electrode layer extends beyond an end portion of the second wiring layer,
wherein the oxide semiconductor layer is electrically connected to a side face and a top face of the first electrode layer and a side face and a top face of the second electrode layer,
wherein the gate insulating film over the gate electrode layer has a region in contact with the oxide semiconductor layer between a region in contact with the first electrode layer and a region in contact with the second electrode layer,
wherein the oxide semiconductor layer is in contact with a side face and a top face of the first wiring layer and a side face and a top face of the second wiring layer, and
wherein the oxide semiconductor layer is in contact with the side face and the top face of the first electrode layer and the side face and the top face of the second electrode layer.

2. The semiconductor device according to claim 1,
wherein a width which is from the end portion of the first electrode layer to the end portion of the first wiring layer or a width which is from the end portion of the second electrode layer to the end portion of the second wiring layer is within the range of from 0.2 µm to 5 µm, inclusive.

3. The semiconductor device according to claim 1,
wherein a thickness of the oxide semiconductor layer is within the range of from 5 nm to 200 nm, inclusive; and
wherein a thickness of the first electrode layer or the second electrode layer is within the range of from 5 nm to 200 nm, inclusive.

4. The semiconductor device according to claim 1,
wherein the oxide semiconductor layer is electrically connected to the side face and the top face of the first wiring layer and the side face and the top face of the second wiring layer.

5. The semiconductor device according to claim 1,
wherein the oxide semiconductor layer comprises indium, gallium, and zinc.

6. The semiconductor device according to claim 1,
wherein a thickness of the first electrode layer and a thickness of the second electrode layer are smaller than a half of a thickness of the oxide semiconductor layer.

7. A semiconductor device comprising:
a first electrode layer and a second electrode layer;
a first wiring layer over the first electrode layer;
a second wiring layer over the second electrode layer;
an oxide semiconductor layer over the first electrode layer and the second electrode layer;
a gate insulating film over the oxide semiconductor layer; and
a gate electrode layer overlapping with end portions of the first electrode layer and the second electrode layer with the gate insulating film therebetween,
wherein the first electrode layer extends beyond an end portion of the first wiring layer,
wherein the second electrode layer extends beyond an end portion of the second wiring layer,
wherein the oxide semiconductor layer is electrically connected to a side face and a top face of the first electrode layer and a side face and a top face of the second electrode layer,
wherein the oxide semiconductor layer is in contact with a side face and a top face of the first wiring layer and a side face and a top face of the second wiring layer, and
wherein the oxide semiconductor layer is in contact with the side face and the top face of the first electrode layer and the side face and the top face of the second electrode layer.

8. The semiconductor device according to claim 7,
wherein a width which is from the end portion of the first electrode layer to the end portion of the first wiring layer or a width which is from the end portion of the second electrode layer to the end portion of the second wiring layer is within the range of from 0.2 µm to 5 µm, inclusive.

9. The semiconductor device according to claim 7,
wherein a thickness of the oxide semiconductor layer is within the range of from 5 nm to 200 nm, inclusive, and
wherein a thickness of the first electrode layer or the second electrode layer is within the range of from 5 nm to 200 nm, inclusive.

10. The semiconductor device according to claim 7,
wherein the oxide semiconductor layer is electrically connected to the side face and the top face of the first wiring layer and the side face and the top face of the second wiring layer.

11. The semiconductor device according to claim 7,
wherein the oxide semiconductor layer comprises indium, gallium, and zinc.

12. The semiconductor device according to claim 7,
wherein a thickness of the first electrode layer and a thickness of the second electrode layer are smaller than a half of a thickness of the oxide semiconductor layer.

* * * * *

UNITED STATES PATENT AND TRADEMARK OFFICE
CERTIFICATE OF CORRECTION

PATENT NO. : 8,841,661 B2
APPLICATION NO. : 12/700758
DATED : September 23, 2014
INVENTOR(S) : Kengo Akimoto et al.

Page 1 of 1

It is certified that error appears in the above-identified patent and that said Letters Patent is hereby corrected as shown below:

In the Specification,

At column 1, line 25, "$(ZnO)_m$," should be --$(ZnO)_m$--;

At column 2, line 25, "$(ZnO)_m$," should be --$(ZnO)_m$--;

At column 10, line 42, "MN," should be --AlN,--;

At column 19, line 25, "bluffing" should be --blurring--;

At column 24, line 13, "51" should be --S1--;

At column 24, line 20, "51" should be --S1--;

At column 24, line 21, "51" should be --S1--;

At column 45, line 14, "can e" should be --can be--;

At column 45, line 20, "incorporate" should be --incorporated--.

Signed and Sealed this
Tenth Day of March, 2015

Michelle K. Lee
*Deputy Director of the United States Patent and Trademark Office*